US012675138B2

(12) United States Patent　　　　(10) Patent No.:　US 12,675,138 B2
Zhu et al.　　　　　　　　　　　　(45) Date of Patent:　　　Jul. 7, 2026

(54) ELECTRONIC DEVICES THAT DETECT ACCESSORY DEVICES AT MULTIPLE LOCATIONS

(71) Applicant: Apple Inc., Cupertino, CA (US)

(72) Inventors: Leyi Zhu, San Jose, CA (US); Hao Zhu, San Jose, CA (US); Yunhe Huang, Pleasanton, CA (US); Fernando F. Cunha, Santa Clara, CA (US); Travis C. Pedley, Los Gatos, CA (US); Guangtao Zhang, Cupertino, CA (US); Annie T. Zhang, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 109 days.

(21) Appl. No.: 18/780,307

(22) Filed: Jul. 22, 2024

(65) Prior Publication Data

US 2025/0341870 A1　　Nov. 6, 2025

Related U.S. Application Data

(60) Provisional application No. 63/641,340, filed on May 1, 2024, provisional application No. 63/641,338, filed on May 1, 2024.

(51) Int. Cl.
G06F 1/16　　　　(2006.01)
G01R 33/00　　　(2006.01)
(52) U.S. Cl.
CPC ....... G06F 1/1675 (2013.01); G01R 33/0047 (2013.01); G06F 1/1686 (2013.01)
(58) Field of Classification Search
CPC ................ G06F 1/1675; G06F 1/1686; G06F 2200/1634; G06F 1/1626; G06F 1/1677; G01R 33/0047
See application file for complete search history.

(56) References Cited

U.S. PATENT DOCUMENTS 9,735,825 B2 *　8/2017　Lee ..................... G06F 1/1671
9,892,602 B2 *　2/2018　Sartee .................... A45C 11/00
(Continued)

FOREIGN PATENT DOCUMENTS

JP　　2015-531507 A　　11/2015
JP　　2021-140760 A　　9/2021

OTHER PUBLICATIONS

Japanese Patent Application No. 2025-068322, Office Action, dated Mar. 30, 2026, 8 pages with English Translation.

*Primary Examiner* — Lisa Lea-Edmonds
(74) *Attorney, Agent, or Firm* — BAKERHOSTETLER

(57)　　　　　　ABSTRACT

Electronic device uses a sensor to determine whether an accessory device covers a housing or the housing and a display. When the electronic device determines, based on the sensor, the housing and display are covered by the accessory device, the electronic device may deactivate the display. Further, when the electronic device determines, based on the sensor, the housing is covered by multiple sections of the accessory device, the electronic device may permit a processor to run at a higher temperature limit, as opposed to a single section covering the housing. In this regard, the accessory device functions as a thermal buffer to absorb thermal energy from the processor(s) running at the higher temperature limit. Additionally, based on the position of the accessory device relative to the electronic device, the electronic device may further activate applications, animations, production information (e.g., regarding the accessory device), or a combination thereof.

20 Claims, 19 Drawing Sheets

(56)     References Cited

U.S. PATENT DOCUMENTS

| | | | |
|---|---|---|---|
| 9,929,767 B2 * | 3/2018 | Peterson | H04M 1/185 |
| 9,954,571 B2 * | 4/2018 | Sartee | H04M 1/0206 |
| 10,024,689 B2 * | 7/2018 | Zhu | G06F 1/1626 |
| 10,056,933 B2 * | 8/2018 | Lee | G06F 3/14 |
| 10,210,975 B1 * | 2/2019 | Ji | H01F 7/0205 |
| 11,108,424 B2 * | 8/2021 | Schooley | H04M 1/04 |
| 11,664,842 B2 * | 5/2023 | Schooley | H04M 1/185 |
| | | | 455/41.2 |
| 11,677,429 B2 * | 6/2023 | Schooley | H04M 1/185 |
| | | | 455/41.2 |
| 11,775,006 B2 * | 10/2023 | Pinciuc | H01F 7/06 |
| | | | 361/142 |
| 12,019,470 B2 * | 6/2024 | Pinciuc | H05K 5/0204 |
| 12,289,128 B2 * | 4/2025 | Schooley | H04M 1/185 |
| 12,461,172 B2 * | 11/2025 | Kim | G01R 33/0023 |
| 2017/0338846 A1 * | 11/2017 | Lee | H04M 1/724092 |
| 2018/0167100 A1 * | 6/2018 | Peterson | H04B 1/3888 |
| 2020/0313712 A1 * | 10/2020 | Schooley | H04B 1/3888 |
| 2021/0391885 A1 * | 12/2021 | Schooley | H04M 1/72412 |
| 2022/0060210 A1 * | 2/2022 | Schooley | H04M 1/72454 |
| 2023/0275611 A1 * | 8/2023 | Schooley | H04M 1/72454 |
| | | | 455/41.2 |
| 2023/0384821 A1 * | 11/2023 | Pinciuc | G01R 33/096 |
| 2025/0341868 A1 * | 11/2025 | Colella | G06F 1/166 |
| 2025/0341870 A1 * | 11/2025 | Zhu | G01R 33/0047 |

* cited by examiner

110a

114b

114a

Z

110a

115a 114b   114a

115b

Z

Y

330

342a

346

345b

345a

110b

102b

110a

102a

330

336a

334

102b

102a

100

ELECTRONIC DEVICES THAT DETECT ACCESSORY DEVICES AT MULTIPLE LOCATIONS

CROSS REFERENCE TO RELATED APPLICATION(S)

The present application claims the benefit of U.S. Provisional Application No. 63/641,338, entitled "ACCESSORY DEVICES USING MAGNETS FOR ADJUSTABLE POSITIONING OF AN ELECTRONIC DEVICE", filed May 1, 2024, and U.S. Provisional Application No. 63/641,340, entitled "ELECTRONIC DEVICES THAT DETECT ACCESSORY DEVICES AT MULTIPLE LOCATIONS", filed May 1, 2024, the entirety of each is incorporated herein for reference.

TECHNICAL FIELD

This application is directed to electronic devices, and more particularly, to electronic devices designed to detect an accessory device covering a display and a housing of the electronic device.

BACKGROUND

Electronic devices may be used with accessory devices. For example, an accessory device may provide a protective cover for the electronic device and support the electronic device. Also, the electronic device may be covered in multiple regions by the accessory device.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
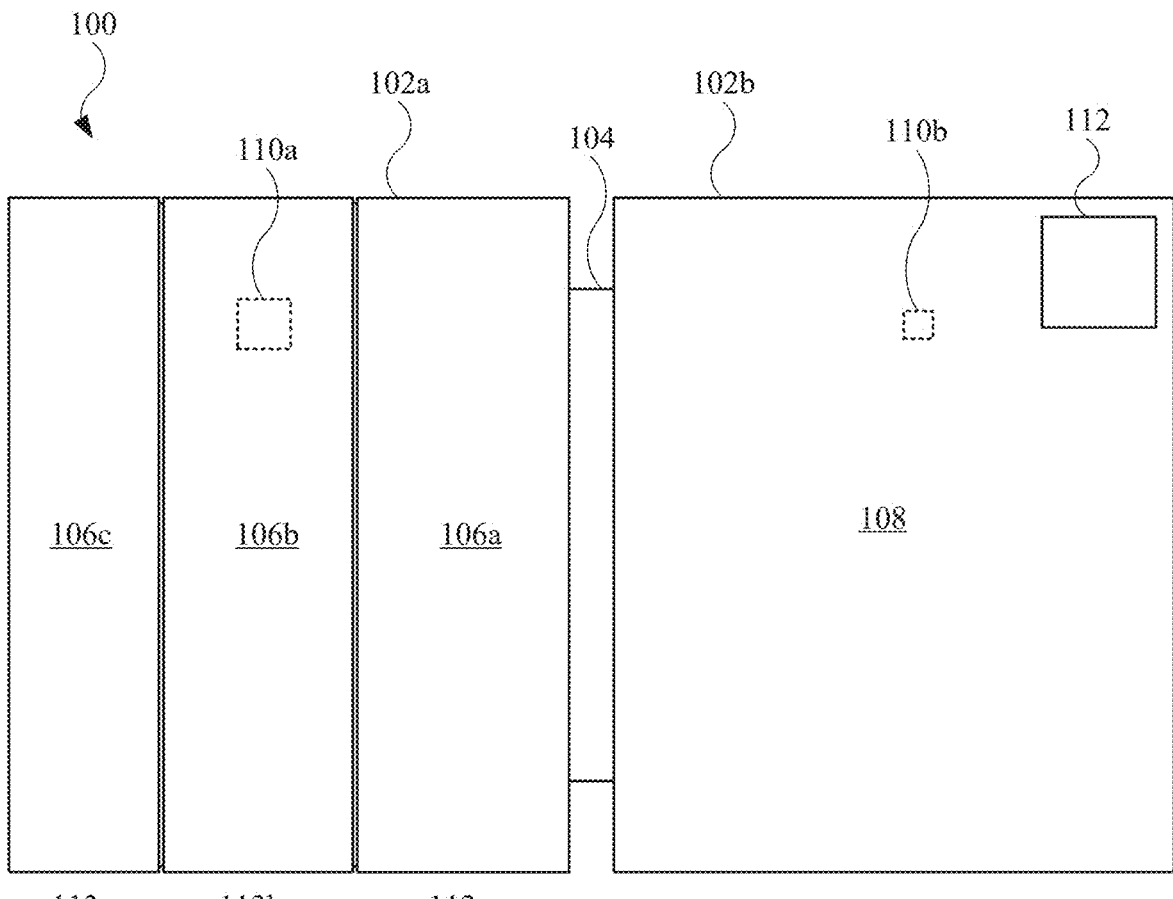
FIG. 1 illustrates a plan view of an embodiment of an accessory device, in accordance with one or more aspects of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The present disclosure is directed to electronic devices capable of detecting the presence of an accessory device. Electronic devices described herein may include a sensor that detects the presence of a magnetic field resulting from multiple magnets located in different sections of an accessory device. For example, the sensor may detect a resultant, or net, magnetic flux, including a direction (e.g., vector) of the magnetic flux, from one or more magnets in a section (of the accessory device) covering a display of the electronic device as well as in a section (of the accessory device) covering a housing of the electronic device. In one or more implementations, the sensor detects a resultant magnetic flux of at least two separate magnets and provides an output based on the resultant magnetic flux. Based on the output, the electronic device may determine at least some components and/or structures are covered by the accessory device. For example, using the output, the electronic device may determine the display is covered by the accessory device and deactivate the display. As a result, the electronic device can reduce battery usage.

Further, when the section covering the display is removed and rotated to engage the other section, the respective magnets in the sections align in a different manner, causing the direction of the resultant magnetic flux to change. The sensor can detect the change in the direction and provide a different output based on the change. Based on the different output, the electronic device may determine the sections of the accessory device are engaged (e.g., in contact with each other), with at least one of the sections engaged with the housing. As a result, multiple sections of the accessory device separate a user from the housing of electronic device, and the electronic device may permit at least one of its processors to operate at a higher performance level (e.g., run additional applications, run higher complexity or intensive applications, or a combination thereof), which may cause the processor(s) to run at a higher temperature limit and generate additional thermal energy (e.g., heat). However, due in part to the multiple sections of the accessory device acting as a thermal buffer to absorb at least some of the thermal energy, the user is less likely to sustain injury in the form heat exposure. Beneficially, the electronic device can rely on logic from a sensor input to operate more efficiently and/or safely.

Additionally, the present disclosure is directed to accessory devices in which several magnets include multi-pole magnets designed to increase magnetic attraction with other magnets, magnetically repel other magnets, or minimize shear forces resulting from magnetic attraction. In one or more implementations, an accessory device includes several segments that are movable (e.g., rotatable) with respect to each other to form various folded configurations, which in turn is used to support a section of the accessory device that holds/supports a portable electronic device. Further, the segment is designed to slide along the section, thus allowing a generally continuous number of angles within a range of angles. However, the accessory device may include at least some magnets designed to repel other magnets, thus providing an indicating that an end angle of the range of has been exceeded. Additionally, the accessory device may include additional magnets designed to magnetically couple with the magnets at each end angle of the range of angles. Based on the multi-pole configuration, the magnetic attraction between magnets when the section is positioned at one of the end angles.

These and other embodiments are discussed below with reference to FIGS. 1-25. However, those skilled in the art will readily appreciate that the detailed description given herein with respect to these Figures is for explanatory purposes only and should not be construed as limiting.

FIG. 1 illustrates a plan view of an embodiment of an accessory device 100, in accordance with one or more aspects of the present disclosure. Accessory device 100 is designed to cover and protect portable electronic devices, such as smartphones and tablet computing devices. Additionally, some regions of accessory device 100 may move and/or bend to orient a portable electronic device at different angles relative to a user, thus providing desirable viewings angles of a display of the portable electronic device.

As shown, accessory device 100 includes a section 102a and a section 102b. Sections 102a and 102b may be coupled, including rotationally coupled, to each other by way of a hinge 104. Hinge 104 may include one or more materials that extend to each of sections 102a and 102b. Section 102a may include multiple segments coupled, including rotationally coupled, to each other. For example, section 102a may include a segment 106a, a segment 106b, and a segment 106c. Each of segments 106a, 106b, and 106c may rotate relative to the remaining segments by way of a hinge (shown, not labeled) between adjacent segments.

Section 102b may define a receiving surface 108 for a portable electronic device, including a housing of the portable electronic device. Further, when section 102b receives a portable electronic device, section 102a may be rotated via hinge 104 to cover a display of the portable electronic device. This will be shown and described in further detail below.

Accessory device 100 may further include several magnets. For example, accessory device 100 includes a magnet 110a located in segment 106c and a magnet 110b located in section 102b. Magnets 110a and 110b may be positioned relative to each other such that when section 102a is positioned over section 102b, magnet 110a is positioned over magnet 110b. Put another way, magnets 110a and 110b may be positioned at corresponding locations of sections 102a and 102b. In this regard, magnet 110a alternatively be located in segment 106a or segment 106b, and magnet 110b may be alternatively positioned in a corresponding location. In one or more implementations, one or more of magnets 110a and 110b are influenced by a magnetizing tool, or magnetizer, thus causing different portions to have a different magnetic flux (e.g., magnetic flux of the same magnet oriented in different directions). Alternatively, in one or more implementations, one or more of the magnets 110a and 110b may take the form of a magnetic assembly that includes two or more magnets. In this regard, magnets shown and/or described herein with portions or regions of different magnetic flux (e.g., direction of magnetic fields different in different regions) may be the result of a single, monolithic magnet with the magnetic flux altered by a magnetizing tool or from the use of multiple, discrete magnetic elements.

Additionally, accessory device 100 may include an opening 112, or through hole, located in section 102b. Opening 112 may be aligned with a camera assembly that includes one or more cameras of a portable electronic device. In this regard, when a portable electronic device is positioned on receiving surface 108, the one or more cameras of the portable electronic device are unobstructed by section 102b based on opening 112.

In one or more implementations, the segments of section 102a have different dimensions. For example, segment 106a, segment 106b, and segment 106c include a dimension 113a, a dimension 113b, and a dimension 113c, respectively, representing a widthwise direction along an X-axis of Cartesian coordinates. As shown, dimension 113c of segment 106c is less than dimension 113a and less than dimension 113b. Based on each of segments 106a, 106b, and 106c having the same or substantially similar lengthwise dimension along the Y-direction, the area of segment 106c is less than that of segment 106a and less than that of 106b.

Figures 2, 3:
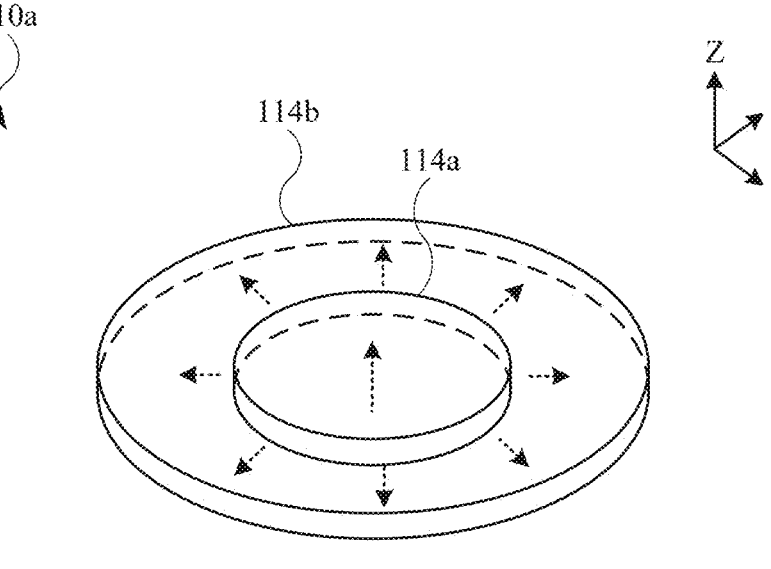
FIG. 2 illustrates a perspective view of an embodiment of a magnet, in accordance with one or more aspects of the present disclosure.
FIG. 3 illustrates a side view of the magnet shown in FIG. 2, further showing the magnetic flux of the magnet in multiple directions, in accordance with one or more aspects of the present disclosure.

FIG. 2 illustrates a perspective view of an embodiment of magnet 110a, in accordance with one or more aspects of the present disclosure. Magnet 110a may include magnetic portions, with each portion having a different magnetic flux. For example, as shown in FIG. 2, magnet 110a includes a magnetic portion 114a and a magnetic portion 114b. Magnetic portion 114a may take the form of a disc, and magnetic portion 114b may surround magnetic portion 114a. Also, magnetic portion 114a may be characterized as a center magnetic portion and magnetic portion 114b may be characterized as an outer magnetic portion. Further, magnet 110a, having magnetic portions with magnetic flux in different directions, may be referred to as a multi-pole magnet.

In order for magnet 110a to achieve a magnetic flux that includes a magnetic field in a desired direction, each of magnetic portions 114a and 114b may be magnetized by a magnetizing tool (not shown in FIG. 2). For example, magnetic portion 114b may include a magnetic flux in which the direction (represented by arrows) is in a radially outward direction, while magnetic portion 114a may include a magnetic flux in which the magnetic field is a normal magnetic field (e.g., perpendicular with respect to magnetic portion 114a). Throughout this detailed description, arrows are used to indicate a direction of the magnetic flux as well as direction of a magnetic field line(s) of the magnetic flux. Thus, the magnetic polarity of the magnetic portions, and in particular adjacent magnetic portions, may differ. While a magnetic field line may extend and curve from a North pole to a South pole, each arrow may represent a direction of the magnetic flux at which the arrow is located. Put another way, each arrow may represent a local direction of the magnetic flux. As shown in FIG. 2, an arrow associated with magnetic portion 114a is pointed along the Z-axis (of Cartesian coordinates) in a positive Z-direction, and arrows associated with magnetic portion 114b are pointed along an X-Y plane.

FIG. 3 illustrates a side view of magnet 110a shown in FIG. 2, further showing the magnetic flux of magnet 110a in multiple directions, in accordance with one or more aspects of the present disclosure. Based on respective magnetic flux from magnetic portions 114a and 114b, the resultant magnetic field (represented by arrows) that are directed toward magnet 110a. For example, the resultant magnetic field is directed toward a surface 115a, or top surface, of magnet 110a, as well as toward a surface 115b, or bottom surface, of magnet 110a, with the surfaces 115a and surfaces 115b being opposite, or opposing, surfaces. Conversely, a traditional magnet may include a magnetic flux in which the magnetic field is directed, for example, away from the upper surface and circling around toward the lower surface.

Figures 4, 5:
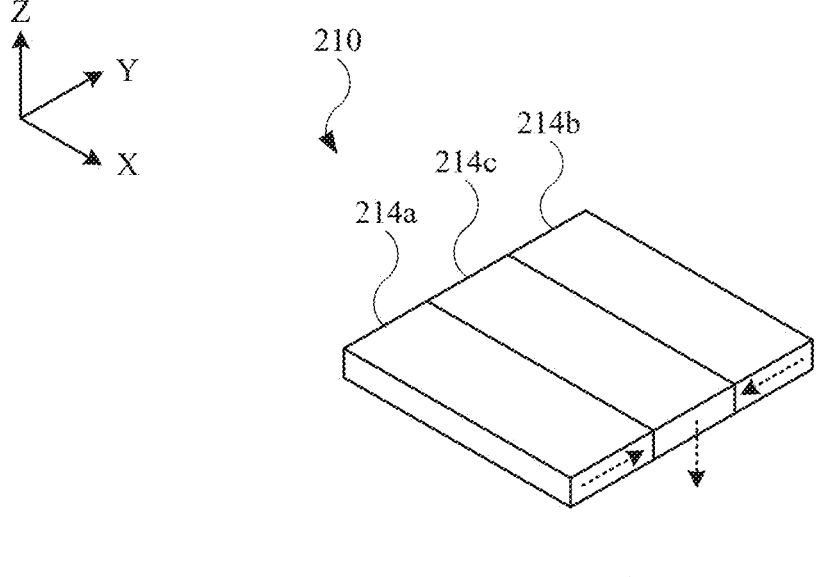
FIG. 4 illustrates a perspective view of an alternate embodiment of a magnet, in accordance with one or more aspects of the present disclosure.
FIG. 5 illustrates a side view of the magnet shown in FIG. 4, further showing the magnetic flux of the magnet in multiple directions, in accordance with one or more aspects of the present disclosure.

FIG. 4 illustrates a perspective view of an alternate embodiment of a magnet 210, in accordance with one or more aspects of the present disclosure. In some instances, magnet 210 may be substituted for magnet 110a in accessory device 100 (shown in FIG. 1). Magnet 210 may include a magnetic portion 214a, a magnetic portion 214b, and a magnetic portion 214c, with magnetic portion 214c being positioned between magnetic portions 214a and 214b. Each of the magnetic portions 214a, 214b, and 214c may include a magnetic flux in different directions. For example, magnetic portion 214a may include a magnetic flux directed toward magnetic portion 214c. Similarly, magnetic portion 214b may include a magnetic flux directed toward magnetic portion 214c. Further, magnetic portion 214c may include a magnetic flux directed away from a lower surface of magnetic portion 214c (e.g., in a negative Z-direction, in Cartesian coordinates). Based on the magnetic portions 214a, 214b, and 214c, magnet 210 may form a Halbach array.

FIG. 5 illustrates a side view of the magnet shown in FIG. 4, further showing the magnetic flux of magnet 210 in multiple directions, in accordance with one or more aspects of the present disclosure. Based on respective magnetic flux from magnetic portions 214a, 214b and 214c, the resultant magnetic flux directed away magnet 210. For example, the resultant magnetic flux is directed away from a surface 215a, or top surface, of magnet 210, as well as away from a surface 215b, or bottom surface, of magnet 210, with the surfaces 215a and 215b being opposite, or opposing, surfaces. In one or more implementations, accessory devices shown and/or described herein include magnet 110a (shown in FIGS. 1-3) or magnet 210.

Referring again to FIG. 1, in one or more implementations, the magnetic flux of magnet 110a may greater than that of the magnet 110b. For example, magnets 110a and 110b may include the same material(s), but as shown in FIG. 1, magnet 110a is greater in size (e.g., is bigger) than magnet 110b, resulting in magnet 110a having a magnetic flux density and magnetic field strength greater than that of magnet 110b. Alternatively, the material(s) of magnet 110a may include a magnetic flux density and magnetic field strength greater than that of magnet 110b. The same relationships may hold true when comparing magnet 210 (shown in FIGS. 4 and 5) with magnet 110b.

Figure 6A:
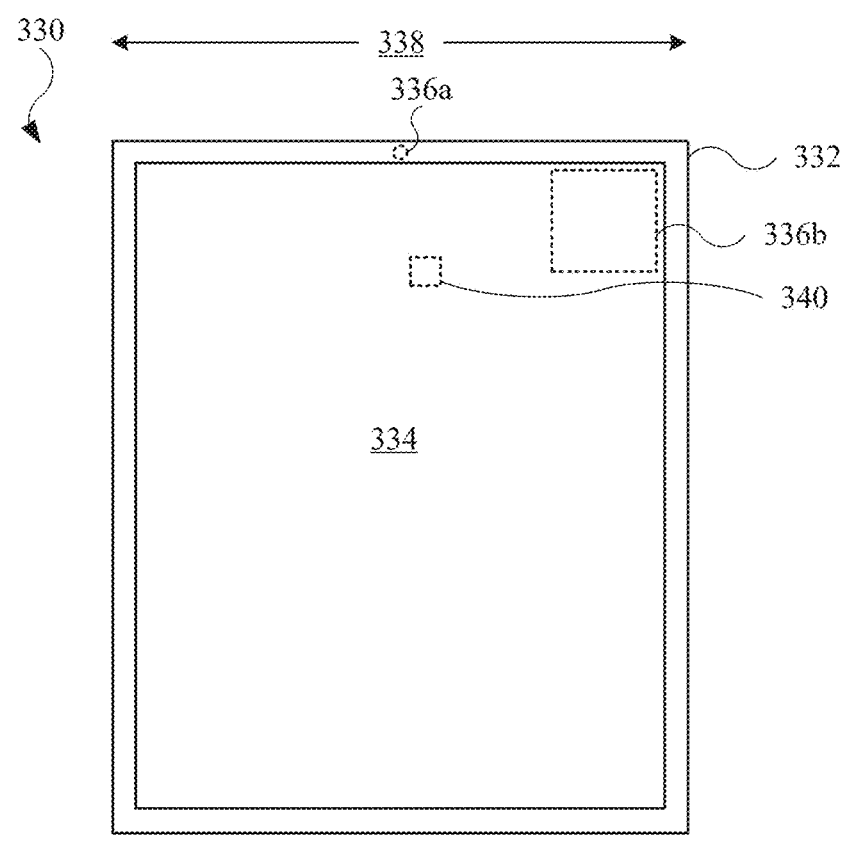
FIG. 6A and FIG. 6B illustrate plan views of embodiments of an electronic device, in accordance with one or more aspects of the present disclosure.
Figure 6B:
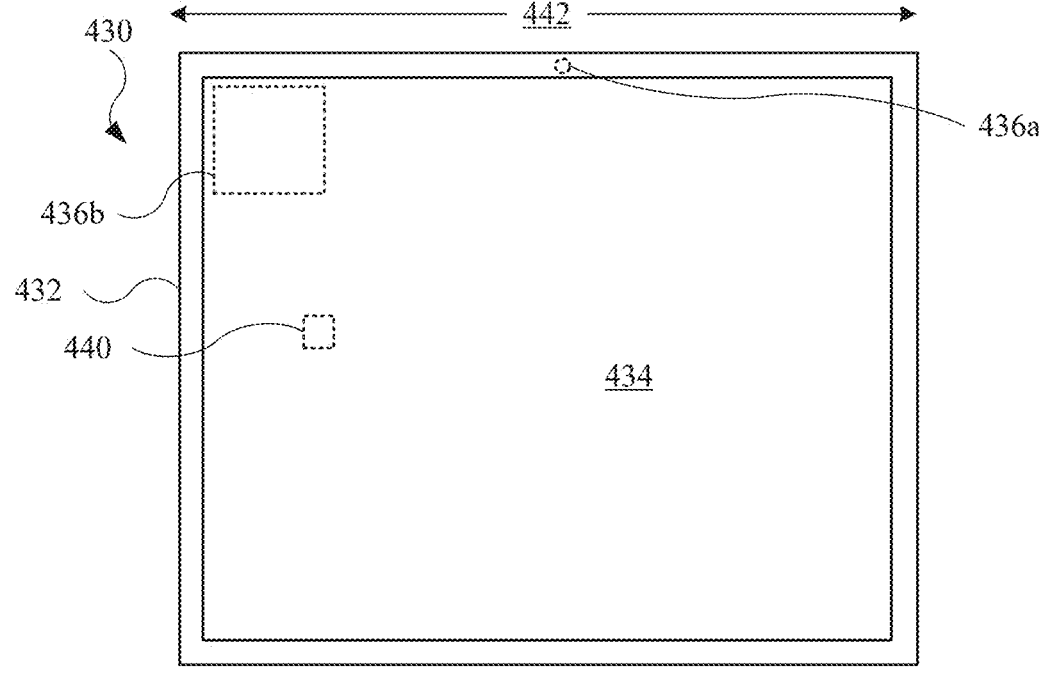

FIG. 6A and FIG. 6B illustrate plan views of embodiments of an electronic device, in accordance with one or more aspects of the present disclosure. Referring to FIG. 6A, an electronic device 330 includes a housing 332, or enclosure, designed to carry various components for electronic device 330. Electronic device 330 may further include a display 334 coupled with, and carried by, housing 332. Display 334 is designed present visual information in the form of text, still images, and/or motion images (e.g., video). Further, electronic device 330 may include a camera assembly 336a and a camera assembly 336b. Camera assembly 336a, representative of one or more cameras, may take the form of a front camera, or front-facing camera, designed to capture images of the environment facing display 334. As shown, camera assembly 336a is located along a dimension 338 of housing 332. Dimension 338 may include a minor dimension, or relatively shorter dimension of housing 332. Camera assembly 336b (shown as dotted lines), representative of one or more cameras, may take the form of a rear camera, or rear-facing camera, designed to capture images of the environment facing housing 332. Electronic device 330 may further include one or more sensors 340. In one or more implementations, at least one of one or more sensors 340 takes the form of a magnetic field sensor designed to detect a magnetic field, including a direction of the magnetic field from magnet flux. In this regard, at least one of one or more sensors 340 may include a Hall Effect sensor.

Referring to FIG. 6B, an electronic device 430 may include any features shown and/or described for electronic device 330 (shown in FIG. 6A). For example, electronic device 430 may include a housing 432, a display 434, a camera assembly 436a, a camera assembly 436b, and one or more sensors 440. Also, camera assembly 436a is located along a dimension 442 of housing 432. Dimension 442 may include a major dimension, or relatively longer dimension of housing 432. Several foregoing examples shown and/or described herein use electronic device 330. However, it should be noted that electronic device 430 may include any features and capabilities shown and/or described for electronic device 330.

FIGS. 7-12 illustrate examples of a sensor in an electronic device detecting magnetic flux, which may include a resultant magnetic flux from multiple magnets. The magnets may be located in different sections of an accessory device shown and/or described herein.

Figure 7:
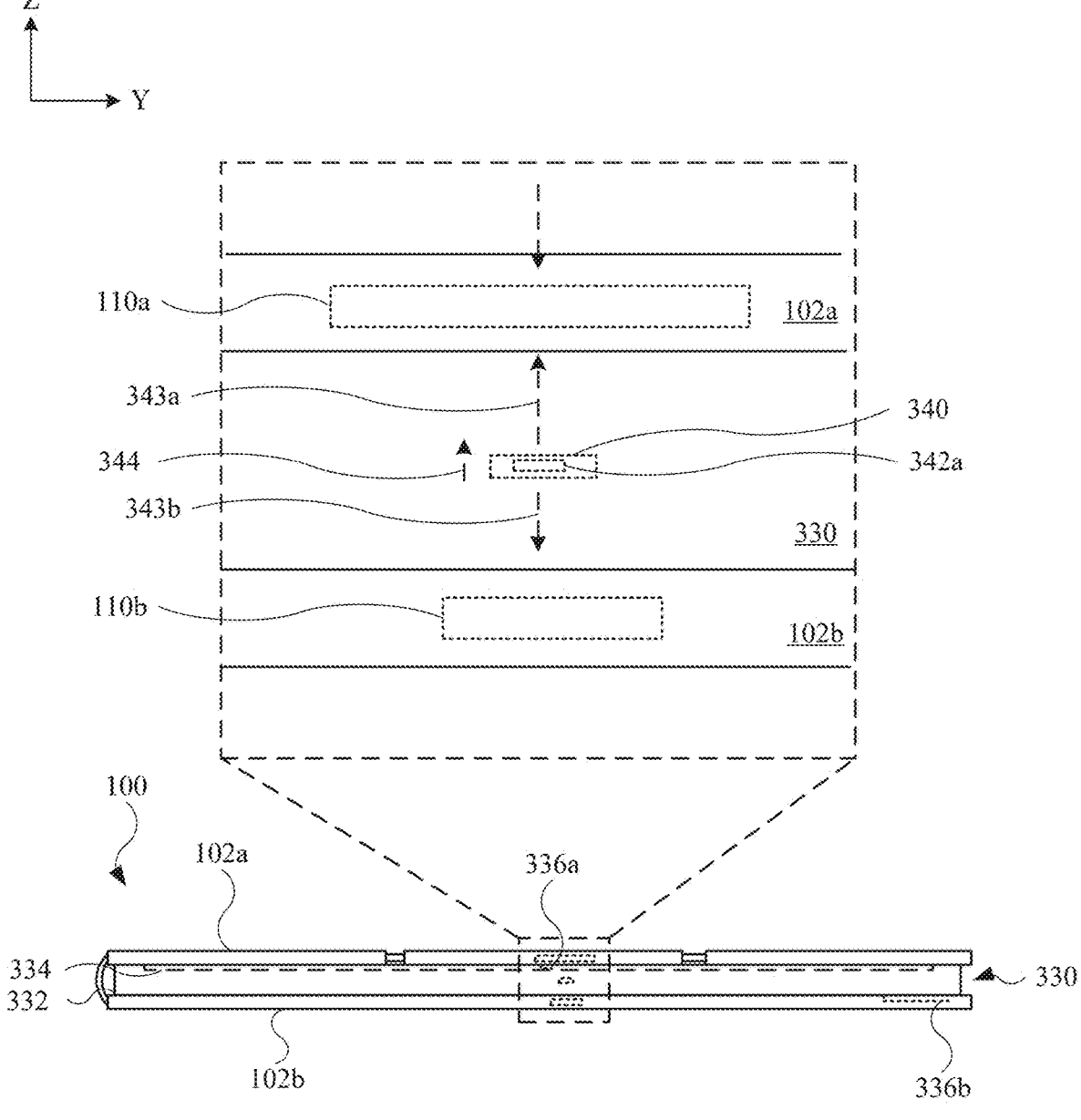
FIG. 7 illustrates a side view of an electronic device and an accessory device, showing an interaction between a sensor of the electronic device and magnets of the accessory device based on a position of the accessory device, in accordance with one or more aspects of the present disclosure.

FIG. 7 illustrates a side view of electronic device 330 and an accessory device 100, showing an interaction between a sensor 342a of one or more sensors 340 of the electronic device and magnets 110a and 110b of accessory device 100 based on a position of accessory device 100, in accordance with one or more aspects of the present disclosure. In one or implementations, sensor 342a takes the form of a magnetic field sensor, such as a Hall Effect sensor (as a non-limiting example). As shown, section 102a covers display 334 and camera assembly 338a of electronic device 330, while section 102b covers housing 332 of electronic device 330. Accordingly, electronic device 330 is positioned between sections 102a and 102b of accessory device 100. However, based on opening 112 (shown in FIG. 1) of section 102b, camera assembly 336b may not be covered by section 102b.

As shown in the enlarged view, sensor 342a is positioned between magnets 110a and 110b. Also, the respective magnetic flux (with the direction of the magnetic field denoted by arrows) of magnet 110a and 110b is shown. Based on the magnetic portions 114a and 114b (shown in FIG. 2) of magnet 110a, the magnetic flux from magnet 110a is directed toward magnet 110a and away from sensor 342a. Further, the magnetic flux from magnet 110b is directed away magnet 110b and away from sensor 342a. In this regard, the respective magnetic flux from magnets 110a and 110b are in opposing directions (e.g., in opposite directions along the Z-axis). In FIG. 7, the arrows provide an example of a vector indicating respective magnitude of the magnetic flux of magnets 110a and 110b. As shown, an arrow 343a represents a vector that is greater in magnitude than a vector represented by an arrow 343b. Based on the magnet 110a having a greater magnetic flux density and magnetic field strength than that of magnet 110b, the direction of the resultant magnetic flux from the combined magnetic flux from magnets 110a and 110b is in the positive Z-direction, and is represented by an arrow 344.

Being withing proximity magnets 110a and 110b, sensor 342a can detect the direction of the resultant magnetic flux and provide an output (e.g., a first output), in the form of a signal, to one or more processors (not shown in FIG. 7) of electronic device 330. The one or more processors may use the signal as an input to logic to determine a direction of the resultant magnetic flux. In this regard, using the signal from sensor 342a, electronic device 330 may determine display 334 and housing 332 are covered by section 102a and section 102b, respectively. Further, the one or more processors may deactivate (e.g., turn off) display 334.

Additionally, at least one processor (e.g., central processing unit or CPU) of the one or more processors may operate while electronic device 330 is covered by accessory device 100 in the manner shown in FIG. 7. The processor(s), however, may be limited or regulated in its operations in order to minimize thermal energy generation and maintain an operating temperature of the processor(s) at or below a temperature limit or temperature threshold, with the operating temperature determined by a temperature sensor (not shown in FIG. 7) of electronic device 330. In this regard, the processor(s) may be limited to operate in accordance with a temperature limit, corresponding to a relatively low temperature limit. As a result, the processor(s) may be limited with respect to operating duration, number of applications being run, type of applications being run, or a combination thereof.

Figure 8:
FIG. 8 illustrates a side view of the electronic device and the accessory device shown in FIG. 7, showing an interaction between a sensor of the electronic device and magnets of the accessory device based on an alternate position of the accessory device, in accordance with one or more aspects of the present disclosure.

FIG. 8 illustrates a side view of electronic device 330 and accessory device 100 shown in FIG. 7, showing an interaction between sensor 342a of electronic device 330 and magnets 110a and 110b of accessory device 100 based on an alternate position of accessory device 100, in accordance with one or more aspects of the present disclosure. As shown, section 102a is rotated away from electronic device 330 and engaged (e.g., positioned against) section 102b. Accordingly, section 102b is positioned between electronic device 330 and section 102a.

Based on the position of section 102a relative to section 102b, the respective magnetic flux from magnets 110a and 110b (denoted by an arrow 345a and an arrow 345b, respectively) are in the same direction, the direction of the resultant magnetic flux (denoted by an arrow 346) from the combined magnetic flux from magnets 110a and 110b is in the negative Z-direction. Sensor 342a can detect the direction (an opposite direction as shown in FIG. 7) of the resultant magnetic flux and provide an output (e.g., a second output) to the one or more processors. The processors may use the signal, indicating a direction of the magnetic flux, as part of logic to determine display 334 is not covered by section 102a, and subsequently activate (e.g., turn on) display 334.

Additionally, the at least one processor of the one or more processors may operate in a different manner while electronic device 330 is partially uncovered by accessory device 100 in the manner shown in FIG. 8. Based on each of sections 102a and 102b covering housing 332 of electronic device 330, a user is shielded from thermal energy generated by the processor(s). As a result, the processor(s) may be permitted to run at a higher temperate limit, as compared to just section 102b covering housing 332, as shown in FIG. 7. Beneficially, the prior limit(s) restricting operating duration, number of applications being run, type of applications being run, or a combination thereof, may be removed. In this regard, the processor(s) may be limited to operate in accordance with a temperature limit, corresponding to a relatively high temperature limit.

Additionally, based on a determination that section 102a is removed from, and not covering, display 334, electronic device 330 may further determine that section 102a is removed from, and not covering, camera assembly 336a (e.g., front camera). In response to determining camera assembly 336a is not covered by section 102a, electronic device 330 may activate, including automatically activate, a software application (e.g., app) that utilizes camera assembly 336a. As non-limiting examples, software applications that may be activated by electronic device 330 include a standard camera application that uses camera assembly 336a to capture images of the ambient environment, a mixed reality application, a social media application, or a video conference application. The activated software application may be presented on display 334, thus allowing a user of electronic device 330 to interact with the software application via display 334 (e.g., by way of a touch input or gesture). As non-limiting examples, other software applications that may be activated by electronic device 300 may include one or more of animations (e.g., display screen animation indicating a device or other accessory is mechanically or electrically coupled with electronic device 330), user interface (UI) features, or production information (e.g., a tutorial regarding the accessory device or a digital stylus suitable for use with electronic device 330, including display 334).

Figure 9:
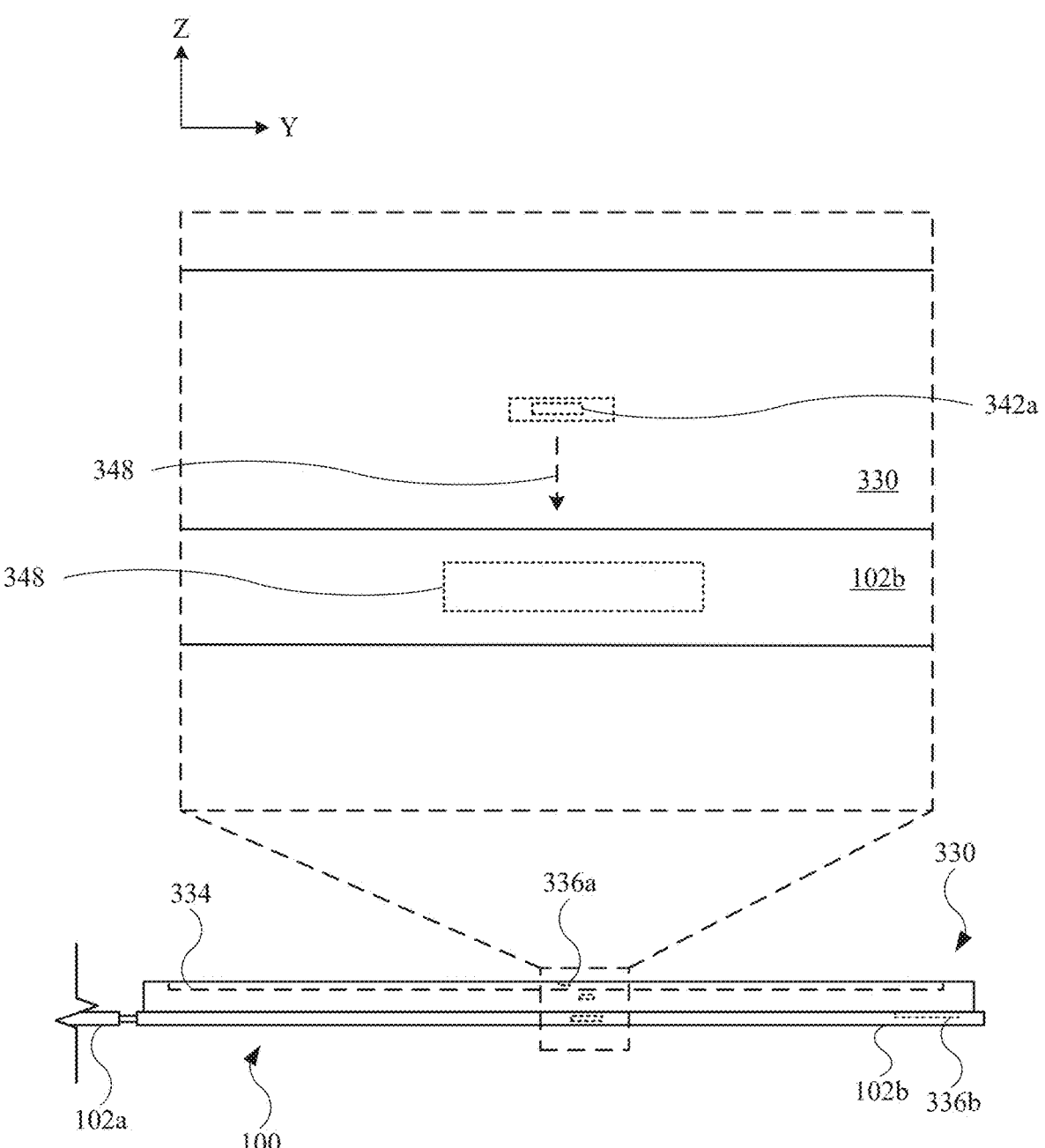
FIG. 9 illustrates a side view of the electronic device and the accessory device shown in FIG. 8, showing an interaction between a sensor of the electronic device and a magnet of the accessory device based on an another alternate position of the accessory device, in accordance with one or more aspects of the present disclosure.

FIG. 9 illustrates a side view of electronic device 330 and accessory device 100 shown in FIG. 8, showing an interaction between sensor 342a of electronic device 330 and magnets 110a and 110b of accessory device 100 based on an another alternate position of accessory device 100, in accordance with one or more aspects of the present disclosure. As shown, section 102a is rotated away from section 102b. Based on the position of section 102a relative to section 102b, sensor 342a detects magnetic flux only from magnet 110b and direction of the magnetic flux (denoted by an arrow 348) is based solely on magnetic flux from magnet 110b, which is in the negative Z-direction. Sensor 342a can detect the direction of the magnetic field and provide an output (e.g., a second output) to the one or more processors. The processors may use the signal, indicating a direction of the magnetic flux, as part of logic to determine display 334 is not covered by section 102a, and activate (e.g., turn on) display 334.

Electronic device 330 may determine that section 102a is not covering display 334 and provide a similar output as described in FIG. 8. Put another way, sensor 342a may provide a discrete signal indicating the magnetic flux is directed in the negative Z-direction without considering the magnitude of the magnetic flux. In this regard, electronic device 330 may not distinguish between the two positions of section 102a shown in FIGS. 8 and 9. However, in one or more implementations, sensor 342a may include capabilities to not only detect the direction of the magnetic flux, but also the magnitude of the magnetic flux. In this regard, sensor 342a may provide different outputs based on whether section 102a is in contact with section 102b (as shown in FIG. 8) or whether section 102a is folded away from section 102b (as shown in FIG. 9), thus allowing electronic device 330 to determine the different positions of section 102a.

In instances when electronic device 330 can determine a location of section 102a when section is rotated away from display 334 and not engaged with section 102b (e.g., as shown in FIG. 9, electronic device 330 may further determine both camera assembly 336a (e.g., front camera(s)) and camera assembly 336b (e.g., rear camera(s)) are also uncovered by section 102a. In response to determining camera assembly 336a and camera assembly 336b are no longer covered by section 102a, electronic device 330 may activate, including automatically activate, a software application (e.g., app) that utilizes camera assembly 336a and/or camera assembly 336b, respectively. An activated software application may include any software application previously described.

In the example shown and described in FIGS. 7-9, sensor 342a is positioned to detect out-of-plane magnetic flux along the Z-direction that is incident on upper and/or lower surfaces of sensor 342a. However, one or more sensors 340 may include an additional sensor positioned to detect inplane magnetic flux in the Y-direction that is incident on one or more lateral surfaces of sensor 342a.

Figure 10:
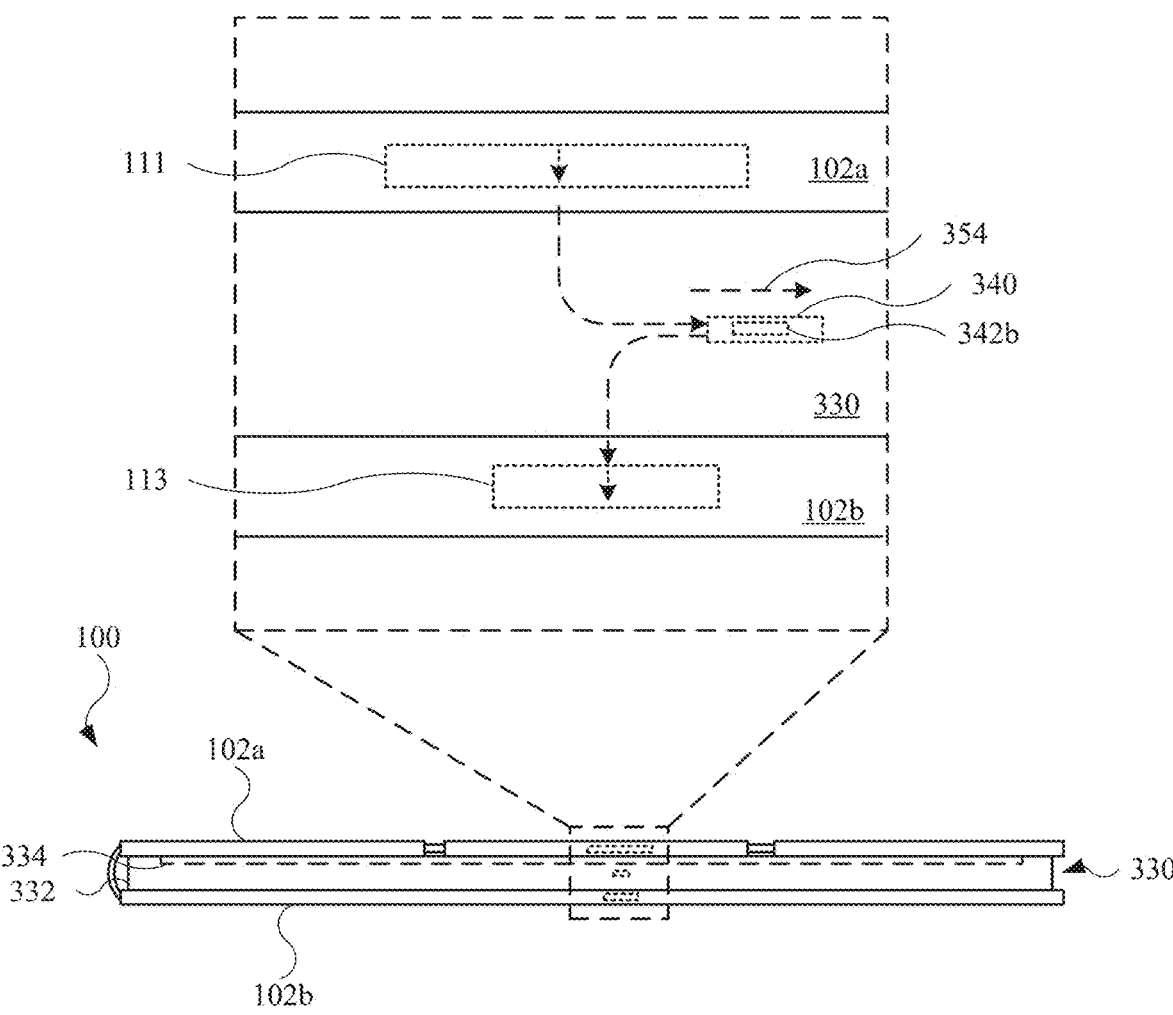
FIG. 10 illustrates a side view of an electronic device and an accessory device, showing an interaction between an alternate sensor of the electronic device and magnets of the accessory device based on a position of the accessory device, in accordance with one or more aspects of the present disclosure.

FIG. 10 illustrates a side view of electronic device 330 and an accessory device 100, showing an interaction between a sensor 342b of electronic device 330 and a magnet 111 and a magnet 113 of accessory device 100 based on a position of accessory device 100, in accordance with one or more aspects of the present disclosure. Each of magnets 111 and 113 may take the form of a conventional magnet with the magnetic flux being generally curved and extending from a North Pole of magnet 111 to a South Pole of the magnet 111. Sensor 342b, along with sensor 342a (shown in FIG. 7), may be part of one or more sensors 340. In one or implementations, sensor 342b takes the form of a magnetic field sensor, such as a Hall Effect sensor (as a non-limiting example). As shown, section 102a covers display 334 of electronic device 330, while section 102b covers housing 332 of electronic device 330. Accordingly, electronic device 330 is positioned between sections 102a and 102b of accessory device 100.

As shown in the enlarged view, sensor 342b is positioned between magnets 111 and 113. Also, the respective magnetic flux (with the direction denoted by arrows) of magnet 111 and 113 is shown. Based on the magnetic flux of magnet 111, the magnetic flux from magnet 111 is directed away from magnet 111 and toward sensor 342b. Further, the magnetic flux from magnet 113 is directed away from sensor 342b and toward magnet 113. In this regard, the respective magnetic flux from magnets 111 and 113 are in opposing directions (e.g., in opposite directions along the Y-axis). In FIG. 10, the arrows provide an example of a vector indicating respective magnitude of the magnetic flux of magnets 111 and 113. Based on the magnet 111 having a greater magnetic flux density and magnetic field strength than that of magnet 113, the direction of the resultant magnetic field (denoted by an arrow 354) from the combined magnetic flux from magnets 111 and 113 is in the positive Y-direction. Similar to sensor 342a (shown in FIG. 7), sensor 342b can detect the direction of the resultant magnetic field and provide an output (e.g., a first output) to the one or more processors. The one or more processors may use the signal, indicating direction of the magnetic flux, as part of logic to determine display 334 and housing 332 are covered by section 102a and section 102b, respectively. Also, the one or more processors may deactivate (e.g., turn off) display 334. Additionally, the at least one processor of the one or more processors may be limited or regulated to operate up to a temperature limit or temperature threshold, as previously described.

Figure 11:
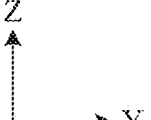
FIG. 11 illustrates a side view of the electronic device and the accessory device shown in FIG. 10, showing an interaction between a sensor of the electronic device and magnets of the accessory device based on an alternate position of the accessory device, in accordance with one or more aspects of the present disclosure.
Figure 11:
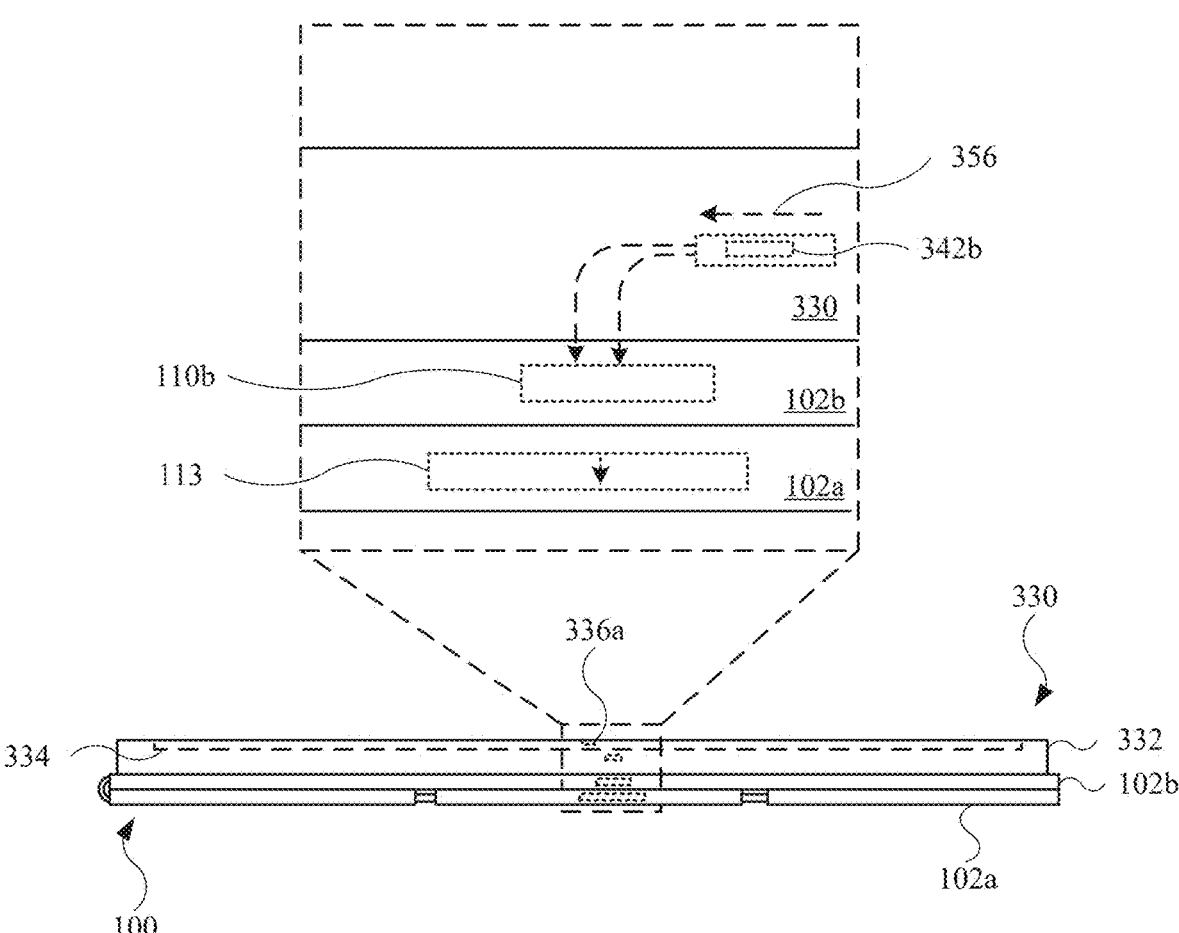

FIG. 11 illustrates a side view of electronic device 330 and accessory device 100 shown in FIG. 10, showing an interaction between sensor 342b of electronic device 330 and magnets 111 and 113 of accessory device 100 based on an alternate position of accessory device 100, in accordance with one or more aspects of the present disclosure. As shown, section 102a is rotated away from electronic device 330 and positioned against section 102b. Accordingly, section 102b is positioned between electronic device 330 and section 102a.

Based on the position of section 102a relative to section 102b, the respective magnetic flux from magnets 111 and 113 are in the same direction, the direction of the resultant magnetic flux (denoted by an arrow 356) from the combined magnetic flux from magnets 111 and 113 is in the negative Y-direction. Sensor 342b can detect the direction of the resultant magnetic flux and provide an output (e.g., a second output) to the one or more processors. The processor(s) may use the signal, indicating direction of the magnetic flux, as part of logic to determine display 334 is not covered by section 102a, and subsequently activate (e.g., turn on) display 334. Additionally, as previously described, the at least one processor may be permitted to run at a higher temperate limit, as compared to just section 102b covering housing 102b. Also, as previously described, electronic device 330 may activate, including automatically activate, a software application based on a determination that camera assembly 336a is not covered by section 102a. Additionally, electronic device 330 may activate one or more of the previously described additional software applications.

Figure 12:
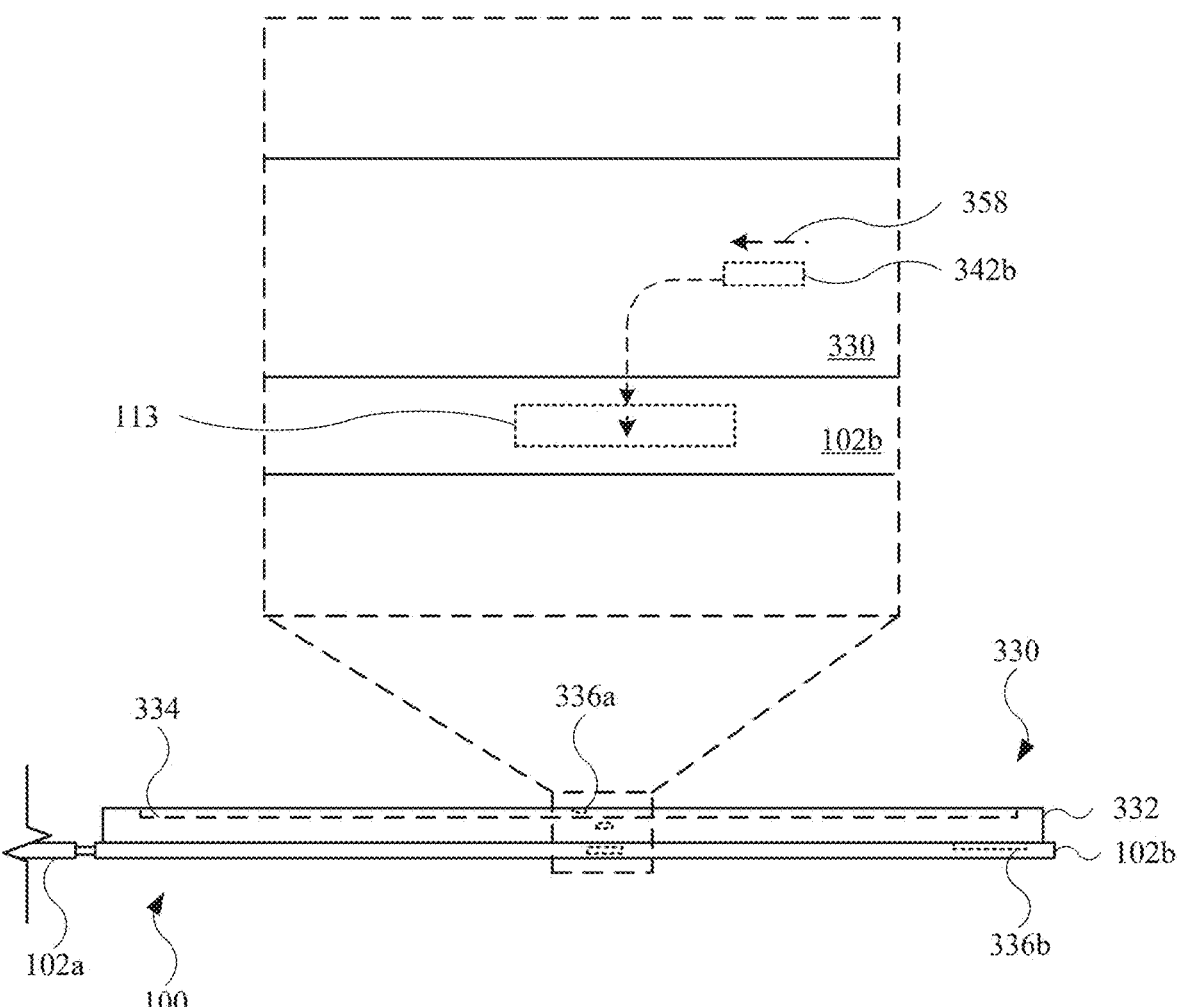
FIG. 12 illustrates a side view of the electronic device and the accessory device shown in FIG. 11, showing an interaction between a sensor of the electronic device and a magnet of the accessory device based on an another alternate position of the accessory device, in accordance with one or more aspects of the present disclosure.

FIG. 12 illustrates a side view of electronic device 330 and accessory device 100 shown in FIG. 11, showing an interaction between sensor 342b of electronic device 330 and magnet 113 of accessory device 100 based on an another alternate position of accessory device 100, in accordance with one or more aspects of the present disclosure. As shown, section 102a is rotated away from section 102b. Based on the position of section 102a relative to section 102b, sensor 342b detects magnetic flux only from magnet 113 and direction of the magnetic flux (denoted by an arrow 358) is based solely on magnetic flux from magnet 113, the direction of which is in the negative Y-direction. Sensor 342b can detect the direction of the magnetic field and provide an output (e.g., a second output) to the one or more processors. The processor(s) may use the signal, indicating direction of the magnetic field, as part of logic to determine display 334 is not covered by section 102a, and activate (e.g., turn on) display 334.

Electronic device 330 may determine that section 102a is not covering display 334 and provide a similar output as described in FIG. 11. Put another way, sensor 342b may provide a discrete signal indicating the magnetic flux is directed in the negative Y-direction without considering the magnitude of the magnetic flux. In this regard, electronic device 330 may not distinguish between the two positions of section 102a shown in FIGS. 11 and 12. However, in one or more implementations, sensor 342b may include capabilities to not only detect the direction of the magnetic flux, but also the magnitude of the magnetic flux. In this regard, sensor 342b may provide different outputs based on whether section 102a is in contact with section 102b (as shown in FIG. 11) or whether section 102a is folded away from section 102b (as shown in FIG. 12), thus allowing electronic device 330 to determine the different positions of section 102a. In one or more implementations, electronic device 330 includes both of sensors 342a and 342b, and uses sensors 342a and 342b for redundancy. Also, as previously described, electronic device 330 may activate, including automatically activate, a software application based on a determination that camera assembly 336a and/or camera assembly 336b are not covered by section 102a.

Figure 13:
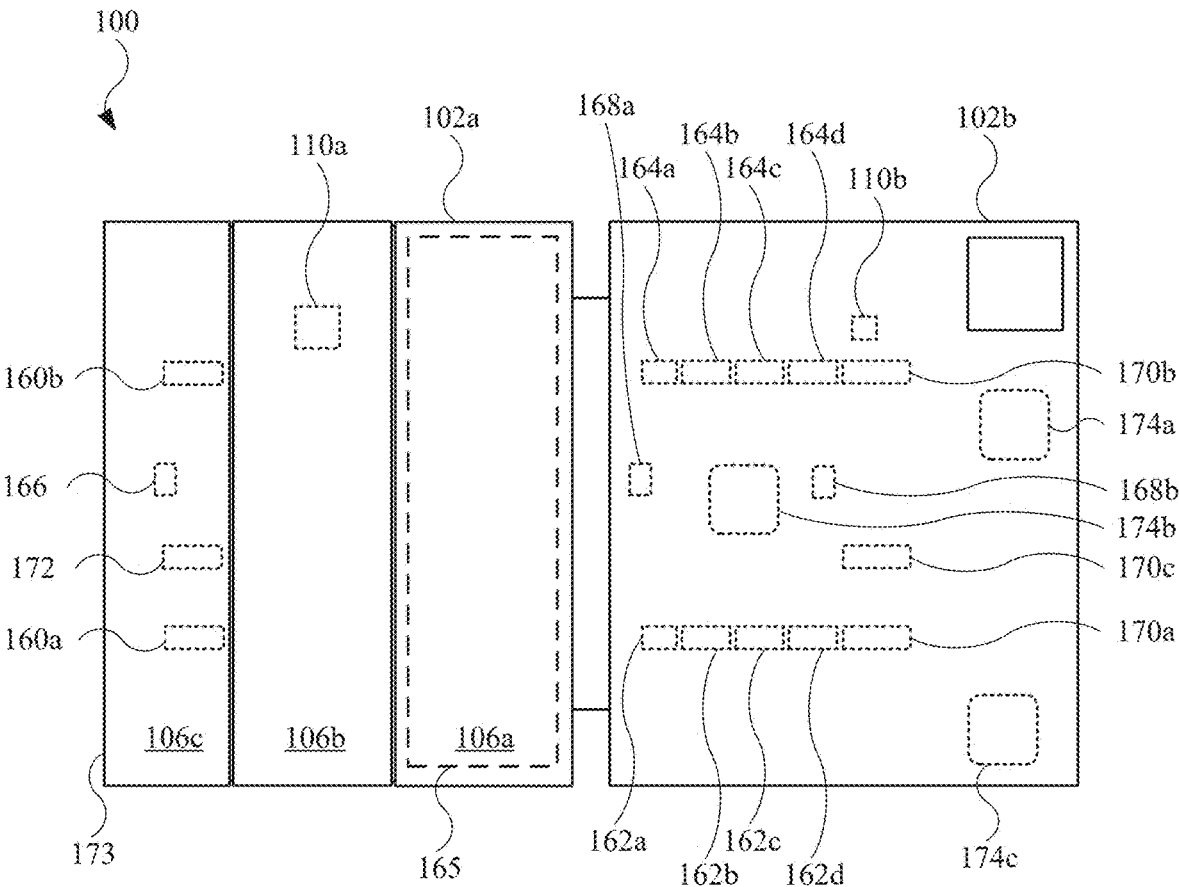
FIG. 13 illustrates a plan view of an accessory device, showing a magnetic layout of additional magnets positioned in the accessory device, in accordance with one or more aspects of the present disclosure.

FIG. 13 illustrates a plan view of accessory device 100, showing a magnetic layout of additional magnets positioned in accessory device 100, in accordance with one or more aspects of the present disclosure. In addition to magnets 110a and 110b, accessory device 100 may further include several magnets. For example, accessory device 100 may include a magnet 160a and a magnet 160b, each of which is located in segment 106c of section 102a. Each of magnets 160a and 160b may magnetically couple with several magnets in a respective set of magnets. For example, accessory device 100 may further include a magnet 162a, a magnet 162b, a magnet 162c, and a magnet 162d, each of which is located in section 102b and representing a set of magnets. Also, accessory device 100 may include a magnet 164a, a magnet 164b, a magnet 164c, and a magnet 164d, each of which is located in section 102b and representing a set of magnets. As shown, each set of magnets may form a row of magnets that includes two or more discrete, or separate, magnets.

In one or more folded configurations (shown below) of section 102a in which at least some of segments 106a, 106b, and 106c are rotated relative to each other, magnet 160a may magnetically couple with at least one of magnets 162a, 162b, 162c, and 162d. Similarly, magnet 160b may magnetically couple with at least one of magnets 164a, 164b, 164c, and 164d. As a result, segment 106c may engage section 102b. The folded configurations may represent section 102a positioning section 102b at a desired angle. Accordingly, when section 102b is coupled with a portable electronic device (e.g., electronic device 330 or electronic device 430, shown in FIGS. 6A and 6B, respectively), the portable electronic device is also positioned at the angle.

Additionally, in one or more implementations, section 102a, in a folded configuration, causes segment 106a to engage a surface (e.g., table, desk, support structure). In order to provide further support for section 102b and the portable electronic device, section 102a may include a weight 165 positioned in segment 106a. In one or more implementations, weight 165 includes glass fiber, including high density glass fiber. Beneficially, weight 165 may lower the center of mass of accessory device 100, thereby improving stability. Although not shown, segments 106b and 106c may also include glass fiber at a relatively lower density as compared to that in segment 106a.

Accessory device 100 may further include a magnet 166, representative of one or more additional magnets, located in segment 106c, as well as a magnet 168a and a magnet 168b, each of which being representative of one or more additional magnets, located in section 102b. When magnet 160a and magnet 160b are magnetically coupled with magnet 162a and magnet 164a, respectively, magnet 166 is magnetically coupled with magnet 168a, and section 102a supports section 102b at an angle. Conversely, when magnet 160a and magnet 160b are magnetically coupled with magnet 162d and magnet 164d, respectively, magnet 166 is magnetically coupled with magnet 168b, and section 102a supports section 102b at another angle. The aforementioned angles represent a largest angle and a smallest angle, respectively, of a range of angles that section 102b may be positioned relative to a horizontal plane. In this regard, magnets 168a and 168b may be associated with opposing end angles of the spectrum of angles. In one or more implementations, magnet 166 magnetically coupling with either magnet 168a or magnet 168b signals to a user that section 102b is at its largest or smallest supported angle. This will be shown and described in further detail below.

Further, magnet 160a and magnet 160b may magnetically couple with magnet 162b and magnet 164b, respectively, or with magnet 162c and magnet 164c, respectively. Moreover, magnet 160a may magnetically couple with at least two adjacent magnets in the row of magnets 162a, 162b, 162c, and 162d, and magnet 160b may magnetically couple with at least two adjacent magnets in the row of magnets 164a, 164b, 164c, and 164d. In this regard, section 102b may be effectively supported at any angle between the range of angles. Also, magnet 160a may be larger (e.g., in size) than each of magnets 162a, 162b, 162c, and 162d, and magnet 160b may be larger (e.g., in size) than each of magnets 164a, 164b, 164c, and 164d. As a result, magnet 160a may partially overlap and magnetically couple with at least two magnets of 162a, 162b, 162c, and 162d, and 160b may partially overlap and magnetically couple with at least two magnets of 164a, 164b, 164c, and 164d.

Additionally, accessory device 100 may include a magnet 170a, a magnet 170b, a magnet 170c, and a magnet 172. As shown, magnets 170a, 170b, and 170c are located in section 102b, while magnet 172 is located in segment 106c of section 102a. In one or more implementations, magnet 170a and magnet 170b are designed to magnetically repel magnet 160a and magnet 160b, respectively. For example, when segment 106c slides along section 102b such that magnet 160a and magnet 160b magnetically couple with magnet 162d and magnet 164d, section 102b may be positioned at an end angle (e.g., second angle) of the range of angles and support of section 102b may no longer be reliable. In order to ensure the second angle is maintained (e.g., not exceeded), magnet 170a and magnet 170b may magnetically repel magnet 160a and magnet 160b, respectively. Moreover, magnet 170c may magnetically repel magnet 172. As a result, the user may not further adjust the angle of section 102b outside of a supported angle. Further, when section 102a is used to support section 102b, one surface of segment 106c is designed to engage section 102b while another opposing surface of segment 106c is not designed to engage section 102b. In this regard, magnets 170a, 170b, and 170c may cause magnetic repulsion of at least some magnets in segment 106c when the incorrect surface of segment 106c engages section 102b. Also, based on their respective positioned, magnet 170a may be part of the set (e.g., row) of magnets associated with 162a, 162b, 162c, and 162d, and magnet 160b may be part of the set (e.g., row) of magnets associated with magnets 164a, 164b, 164c, and 164d.

Additionally, based on the relationship among segments 106a, 106b, and 106c, segment 106c defines an edge 173 of accessory device 100, including section 102a. Further, segment 106c may be referred to as an outer segment as segments 106a and 106b are positioned between segment 106c and section 102b.

While accessory device 100 may include weight 165 designed to increase the mass at a particular location, accessory device 100 may include features designed to remove the mass in other locations. For example, accessory device 100 may include an insert 174a, an insert 174b, and an insert 174c. Inserts 174a, 174b, and 174c, representative of additional inserts, may be positioned in voids, or spaces, formed in section 102b, with the voids representing material removed from section 102b. In one or more implementations, inserts 174a, 174b, and 174b take the form of a foam material, including polymethacrylimide (PMI) as a non-limiting example. Inserts 174a, 174b, and 174c are designed and positioned to replace the removed material. Further, inserts 174a, 174b, and 174c may be less dense, and weigh less, than the removed material (e.g., low density glass fiber). In this regard, section 102b may weigh less based in part on inserts 174a, 174b, and 174c as compared to section 102b without the removed material. Beneficially, the center of mass of accessory device 100 may be further lowered, thus increasing the overall stability of accessory device 100.

Figure 14:
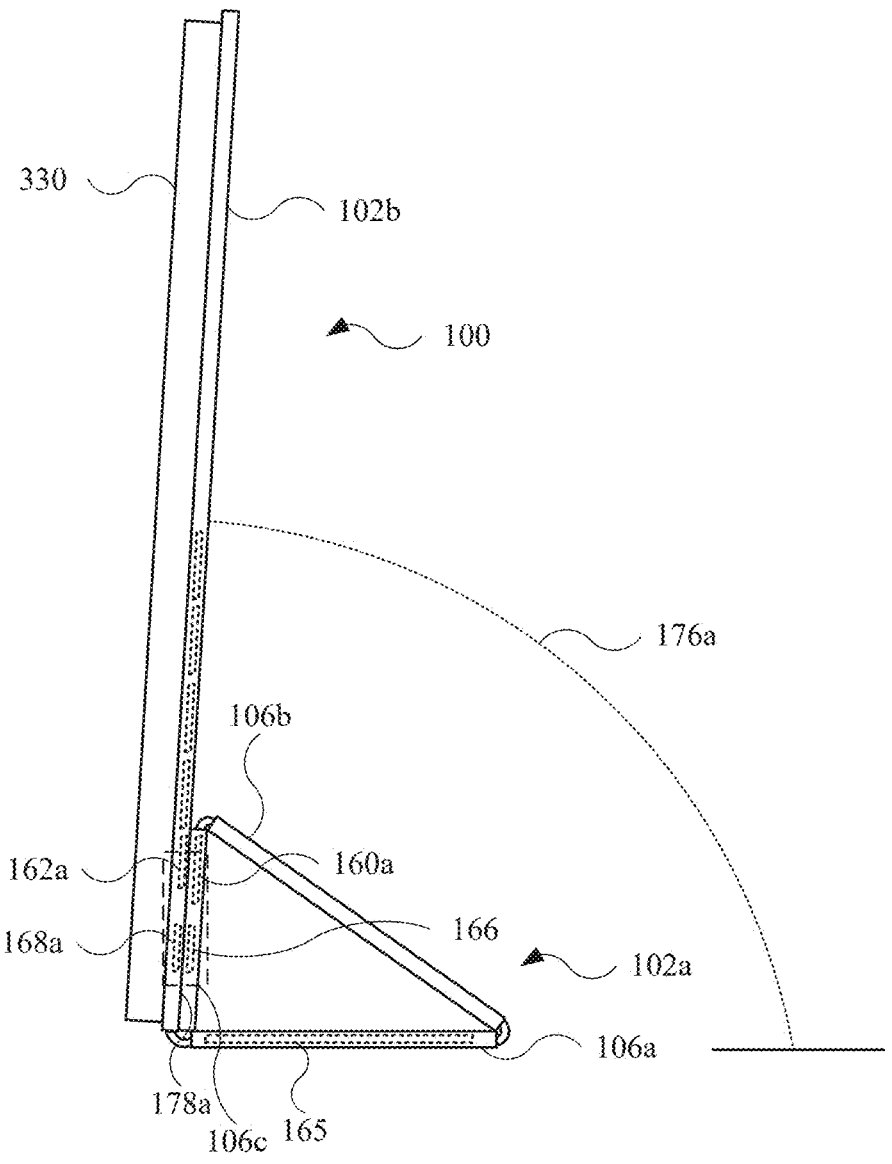
FIG. 14 and FIG. 15 illustrate side views of an accessory device supporting an electronic device at different angles, in accordance with one or more aspects of the present disclosure.

FIG. 14 illustrates a side view of accessory device 100 supporting electronic device 330 at an angle, in accordance with one or more aspects of the present disclosure. At least some of the magnets shown and/or described in FIG. 13 located in section 102b may magnetically couple with one or more magnets (not shown in FIG. 14) of electronic device 330. As shown, sections 102a is in a folded configuration and supports section 102b and electronic device 330 at an angle 176a. Weight 165, located in segment 106a, provides added stability, and segment 106b supports at least some of the weight of electronic device 330 and section 102b. Further, segment 106c, and in particular a surface 178a of segment 106c, engages section 102b. Also, magnet 160a is magnetically coupled with magnet 162a. Although not shown, based on the position of segment 106c, magnet 160b is magnetically coupled with magnet 164a (both shown in FIG. 14). Additionally, magnet 166 is magnetically coupled with magnet 168a, indicating angle 176a is the first angle, corresponding to the largest angle in the range of angles. Angle 176a may be approximately in the range of 80 to 90 degrees. Additionally, segment 106c may engage segment 106a, thus providing a mechanical stop to limit section 102a from positioning section 102b at an angle beyond (e.g., greater than) angle 176a.

Figure 15:
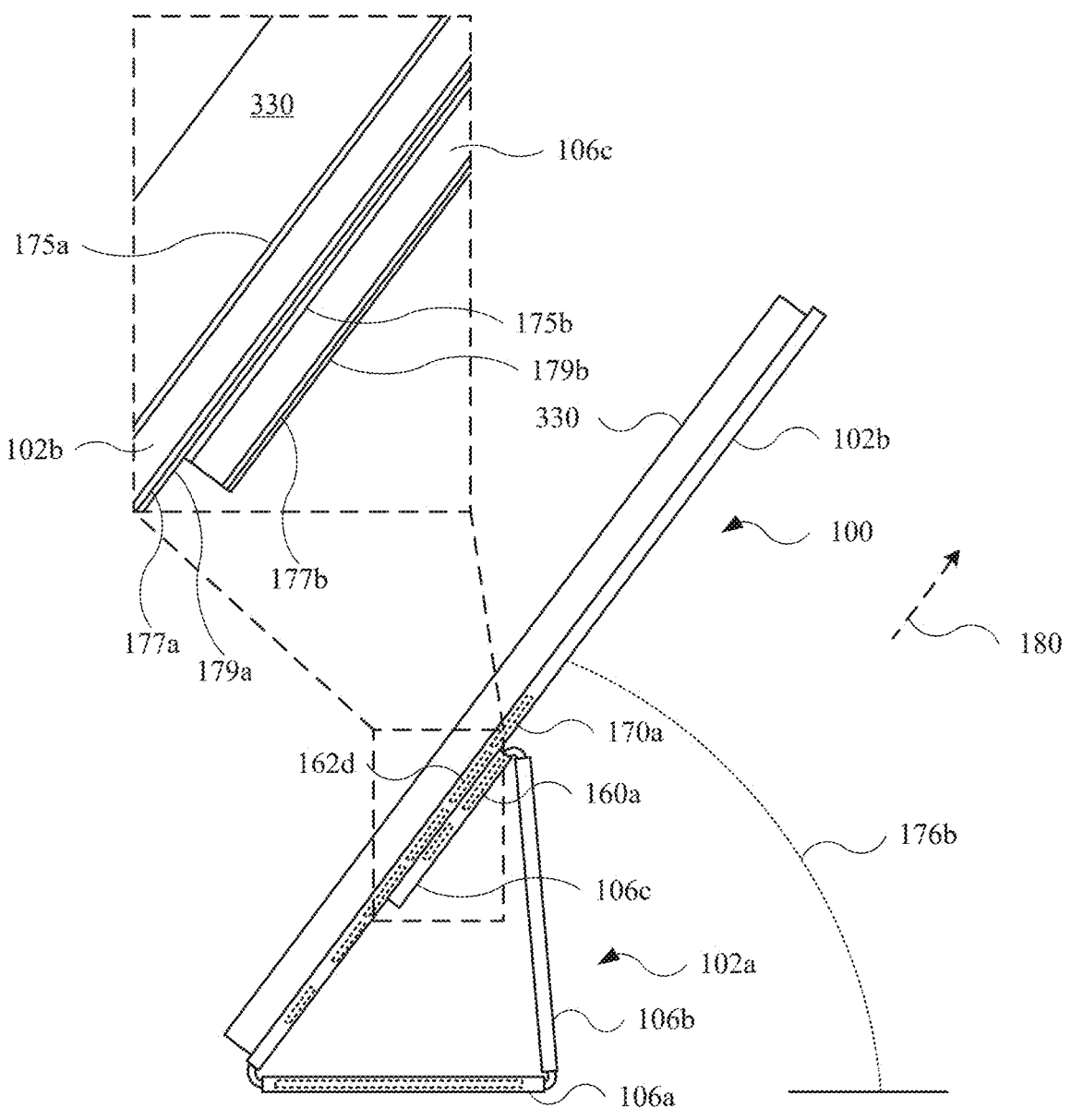

FIG. 15 illustrates a side view of accessory device 100 supporting electronic device 330 at an alternate angle, in accordance with one or more aspects of the present disclosure. As shown, sections 102a is in a folded configuration and supports section 102b and electronic device 330 at an angle 176b. While segment 106c may remain generally stationary, segment 106b is rotated to support at least some of the weight of electronic device 330 and section 102b at angle 176b. Further, segment 106c may move (e.g., slide) along a surface of section 102b such that magnet 160a is magnetically coupled with magnet 162d. Although not shown, based on the position of segment 106c, magnet 160b is magnetically coupled with magnet 164d (both shown in FIG. 14). Additionally, magnet 166 is magnetically coupled with magnet 168b, indicating angle 176b is the second angle, corresponding to the smallest angle in the range of angles. Angle 176b may be approximately in the range of 30 to 50 degrees. Moreover, further attempted (relative) movement of segment 106c in a direction of arrow 180 would cause magnet 160a to be magnetically repelled by magnet 170a, thus causing section 102a to maintain section 102b at or above (e.g., greater than) angle 176b. Accordingly, magnet 170a, used to repel magnet 160a, may assist in preventing section 102b from being positioned at an angle below angle 176b. Further, the magnetic repulsion of magnet 160a by magnet 170a may provide an indication to a user of accessory device 100 that a minimum angle of stability (e.g., angle 176b) is being crossed (or attempted to be crossed) and section 102a may no longer reliably support section 102b. Although not shown, the additional attempted movement of segment 106c would cause magnet 160b to be magnetically repelled by magnet 170b (both shown in FIG. 13). Still further, the additional attempted movement of segment 106c would cause magnet 172 to be magnetically repelled by magnet 170c (both shown in FIG. 13).

Accessory device 100 may include various layers of material. For example, as shown in the enlarged view, accessory device 100 may include a layer 175a positioned on section 102b and engaged with electronic device 330, and a layer 175b positioned on segment 106c. In one or more implementations, each of layers 175a and 175b includes a knitted fabric, such as brush knit (as a non-limiting example). Although not shown, layer 175b may also be positioned on each of segments 106b and 106c. Additionally, accessory device 100 may include a layer 177a positioned on section 102b and a layer 177b positioned on segment 106c. In one or more implementations, each of layers 177a and 177b includes a polymer-based material such as poly-urethane, including PUK (as a non-limiting example). Additionally, accessory device 100 may include a layer 179a positioned on layer 177a and a layer 179b positioned on layer 177b. In one or more implementations, each of layers 179a and 179b includes a stain-resistant coating, thus minimizing the likelihood of unwanted discoloration of accessory device 100. Additionally, layers 179a and 179b may provide a reduced coefficient of friction, as compared to layers 175a and 175b. Beneficially, segment 106c may more readily move along section 102b.

Referring to FIG. 14 and FIG. 15, angles 176a and 176b may be referred to as end angles. In this regard, angle 176a represents an end angle that is the highest angle that section 102b is reliably supported by section 102a. Conversely, angle 176b represents an end angle that is the lowest angle allowable that section 102b is reliably supported by section 102a. Although not shown, it should be noted that the sets of magnets (e.g. magnets 162a, 162b, 162c, and 162d, as well as magnets 164a, 164b, 164c, and 164d) not only permit section 102a to support section 102b at angles 176a and 176b, but also any angle between angles 176a and 176b.

FIG. 16, FIG. 17, FIG. 18A, FIG. 18B, and FIG. 19 illustrate various magnets of accessory device 100, showing the direction of the magnetic flux at different magnetic portions of the magnets, in accordance with one or more aspects of the present disclosure.

Figure 16:
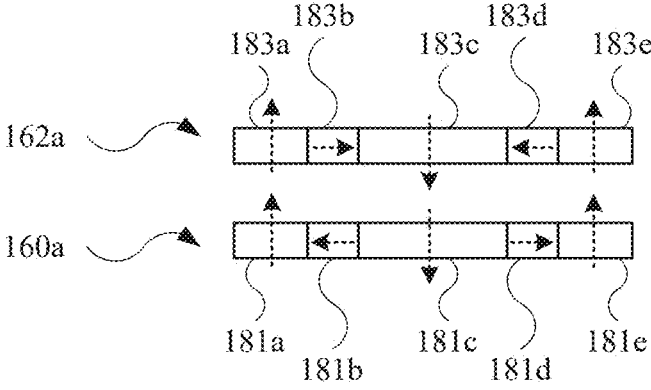
FIG. 16, FIG. 17, FIG. 18A, FIG. 18B, and FIG. 19 illustrate various magnets of an accessory device, showing the direction of the magnetic flux at different magnetic portions of the magnets, in accordance with one or more aspects of the present disclosure.

Referring to FIG. 16, magnet 160a, located in segment 106c (shown in FIG. 13) is magnetically coupled with a magnet 162a, located in section 102b (shown in FIG. 13). As shown, magnet 160a, representative of magnet 160b (shown in FIG. 13), includes several magnetic portions. For example, magnet 160a may include a magnetic portion 181a, a magnetic portion 181b, a magnetic portion 181c, a magnetic portion 181d, and a magnetic portion 181c. The arrows indicate a respective direction of the magnetic flux for the magnetic portions 181a, 181b, 181c, 181d, and 181e. Also, magnet 162a, representative of magnets 162b, 162c, 162d, 164a, 164b, 164c, and 164d (shown in FIG. 13), includes several magnetic portions. For example, magnet 162a may include a magnetic portion 183a, a magnetic portion 183b, a magnetic portion 183c, a magnetic portion 183d, and a magnetic portion 183e. The arrows indicate a respective direction of the magnetic flux for the magnetic portions 183a, 183b, 183c, 183d, and 183e. In this regard, each of magnet 160a and magnet 162a may be referred to as a five-pole magnet based on magnets 160a and 162a each having five distinct magnetic portions in which adjacent magnetic portions are different.

Based on the direction of the magnetic flux, magnet 160a may magnetically couple with magnet 162b at each respective magnetic portion. For example, each magnetic portions 181a and 183a, magnetic portions 181c and 183c, and magnetic portions 181e and 183e may cause segment 106c to engage, and remained engaged with, section 102b, as shown in FIG. 14. Further, each magnetic portions 181b and 183b and magnetic portions 181d and 183d may cause segment 106c to align with section 102b, thus preventing segment 106c from being crooked, or misaligned, with respect to section 102b. In this regard, the respective multipole configurations of magnets 160a and 162a are optimized for attraction force, shear resistance, and rotational micro alignment.

Figure 17:
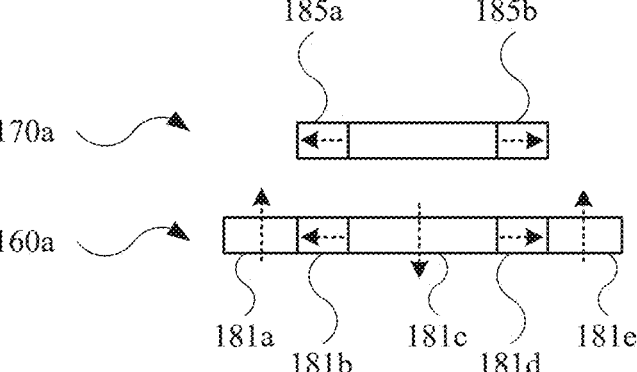

Referring to FIG. 17, magnet 160a is aligned with magnet 170a located in section 102b (shown in FIG. 13). Based on their respective magnetic portions, magnet 170a is designed to magnetically repel magnet 160a. As shown, magnet 170a, representative of magnet 170b (shown in FIG. 14), includes a magnetic portion 185a and a magnetic portion 185b. Based on the direction of the magnetic flux, magnet 160a may be magnetically repelled by magnet 170a at several magnetic portions, including between magnetic portions 181b and 185a and between magnetic portions 181d and 185b. In this regard, magnet 170a may be referred to as a two-pole magnet based on magnet 170a having two distinct magnetic portions.

Figure 18A:
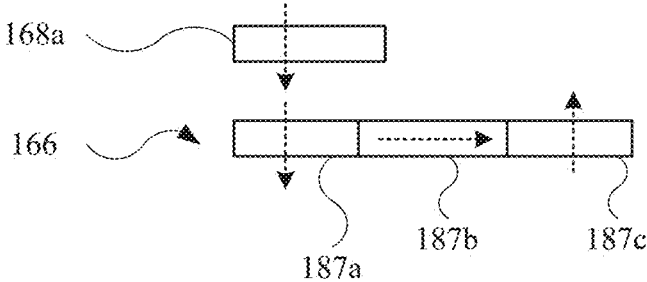

Referring to FIG. 18A, magnet 166 is aligned with magnet 168a located in section 102b (shown in FIG. 13). Based on their respective magnetic portions, magnet 168a is designed to magnetically couple with magnet 166. As shown, magnet 166 includes a magnetic portion 187a, a magnetic portion 187b, and a magnetic portion 187c. Accordingly, magnet 166 may be referred to as a three-pole magnet and magnet 168a, having a single magnetic portion, may be referred to as a one-pole magnet.

Figure 18B:
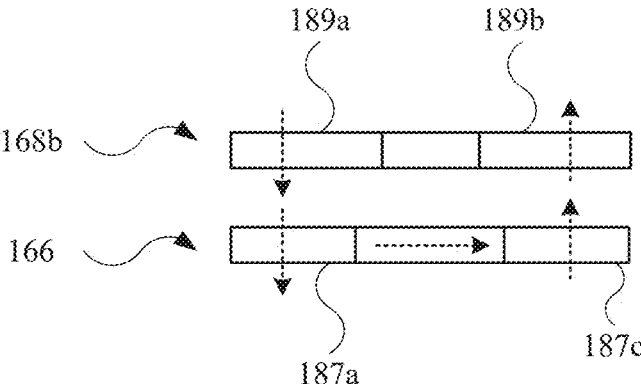

Referring to FIG. 18B, magnet 166 is aligned with magnet 168b located in section 102b (shown in FIG. 13). Based on their respective magnetic portions, magnet 168b is designed to magnetically couple with magnet 166. Magnet 168b includes a magnetic portion 189a and a magnetic portion 189b. Based on the direction of the magnetic flux, magnet 166 may magnetically couple with magnet 168b at several magnetic portions, including between magnetic portions 187a and 189a and magnetic portions 187c and 189b. In one or more implementations, the magnetic pole pattern (e.g., magnetic portions 189a and 189b) of magnet 168b creates an oscillating normal force and sliding direction shear force when magnet 166 magnetically couples with magnet 168b, which may provide for a "mechanical" click feel to users. Put another way, the users may experience a different feeling when holding accessory device 100 (shown in FIG. 15) when magnet 166 magnetically couples with magnet 168b, indicating to the user that section 102b is positioned at the second angle, respectively. For example, while sliding segment 106c (shown in FIG. 15) along section 102b to align magnets 166 and 168b, a user may feel a magnetic repulsion followed by a magnetic attraction, thus mimicking a click feel.

Figure 19:
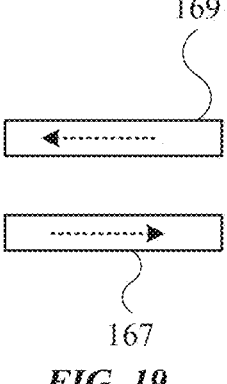

Referring to FIG. 19, an alternate example illustrates a magnet 167 and a magnet 169. Magnet 167 may be positioned in segment 106c (shown in FIG. 13) while magnet 169 may be positioned section 102b (shown in FIG. 13). In one or more implementations, magnet 166 (shown in FIG. 13) is substituted with magnet 167, and each of magnets 168a and 168b (shown in FIG. 13) are substituted with magnet 169. As shown, each of magnets 167 and 169 may be magnetized to generate magnetic flux that passes, or substantially passes, laterally through the respective magnetic bodies of magnet 167 and 169.

Figure 20:
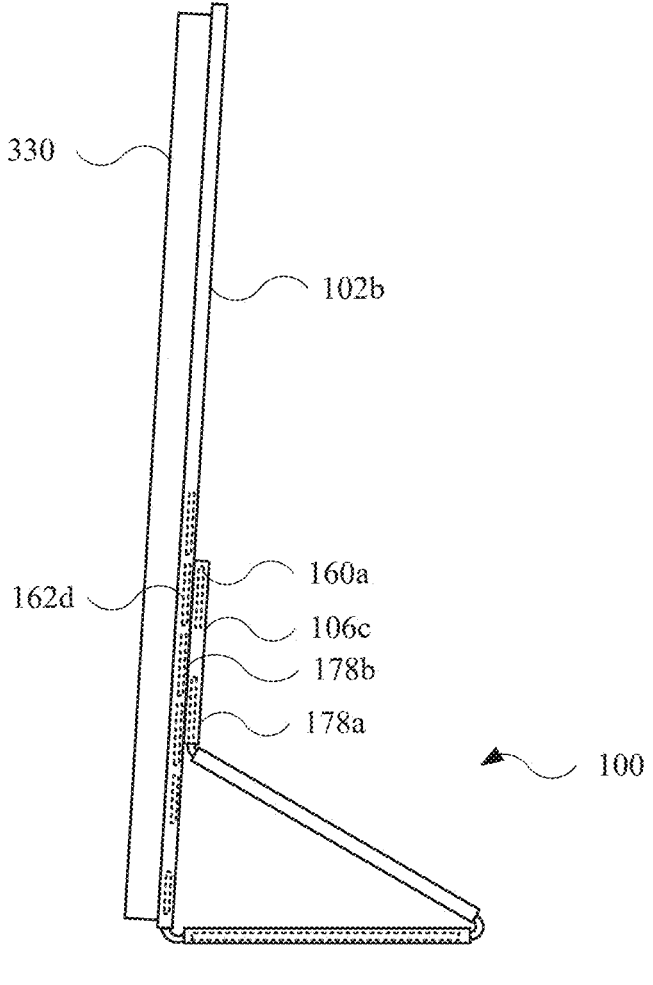
FIG. 20 illustrates a side view of an accessory device and an electronic device, showing a segment of the accessory device oriented in a different manner, in accordance with one or more aspects of the present disclosure.

FIG. 20 illustrates a side view of accessory device 100 and electronic device 330, showing segment 106c of the accessory device 100 oriented in a different manner, in accordance with one or more aspects of the present disclosure. As shown, a surface 178b of segment 106c is engaged with section 102b, contrary to FIGS. 14 and 15 in which surface 178a of segment 106c engages section 102b. Based on the alignment between segment 106c and section 102b, magnet 160a is aligned with magnet 162d. However, based on this alignment, at least one magnet in segment 106c may be magnetically repelled by at least one magnet in section 102b, causing segment 106c to be misaligned with section 102b and thus indicating to a user that accessory device 100 is not properly configured to support electronic device 330.

Figure 21:
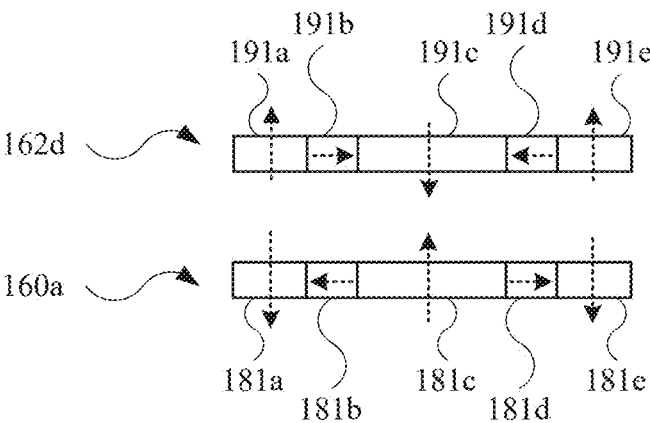
FIG. 21 and FIG. 22 illustrate magnets of an accessory device, showing the direction of magnetic flux at different magnetic portions of the magnets, in accordance with one or more aspects of the present disclosure.
Figure 22:
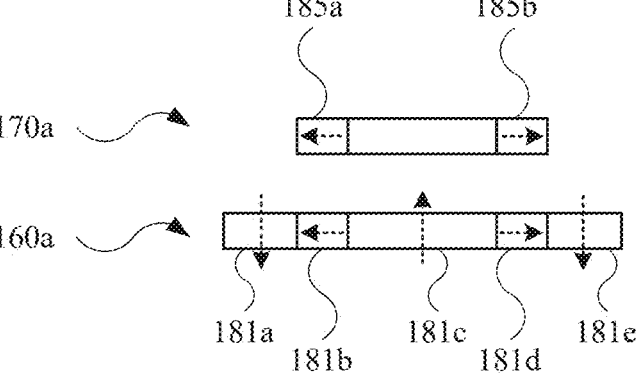

FIG. 21 and FIG. 22 illustrate magnets of an accessory device, showing the direction of magnetic flux at different magnetic portions of the magnets, in accordance with one or more aspects of the present disclosure.

Referring to FIG. 21, magnet 162d may include a magnetic portion 191a, a magnetic portion 191b, a magnetic portion 191c, a magnetic portion 191d, and a magnetic portion 191c. The alignment of magnets 160a and 162d represent an alignment shown in FIG. 20 when surface 178b of segment 106c engages section 102b. The arrows indicate a respective direction of the magnetic flux for the magnetic portions 191a, 191b, 191c, 191d, and 191e. Based on the direction of the magnetic flux when magnets 160a and 162d are aligned, each of the respective magnetic portions of magnets 160a and 162d may magnetically repel each other, including magnetic portions 181a and 191a, 181c and 191c, and 181e and 191e. The repulsion may further cause shear forces to move segment 106c laterally with respect to section 102b.

Referring to FIG. 22, magnet 160a is aligned with magnet 170a located in section 102b (shown in FIG. 13). Based on their respective magnetic portions, magnet 170a designed to magnetically repel magnet 160a. As shown, magnet 170a, representative of magnet 170b (shown in FIG. 14, includes a magnetic portion 185a and a magnetic portion 185b. Based on the direction of the magnetic flux, magnet 160a may be magnetically repelled by magnet 170a at several magnetic portions, including between magnetic portions 181b and 185a and magnetic portions 181d and 185b. It should be noted that the alignment of magnetic portions and their respective magnetic flux between magnets 160a and 170a is effectively the same as that shown in FIG. 17. Accordingly, magnet 170a is designed to magnetically repel magnet 160a regardless of the different orientations of segment 106c (e.g., shown in FIGS. 15 and 20).

Figure 23:
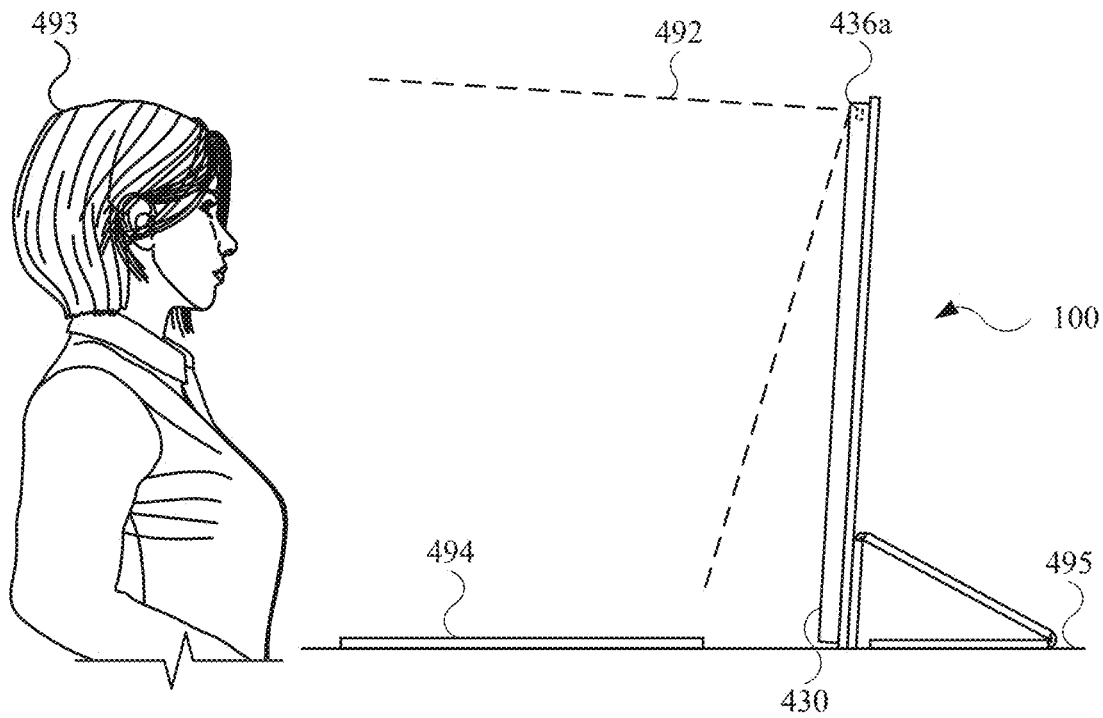
FIG. 23 illustrates a side view of an accessory device supporting an electronic device, further showing a camera assembly of the electronic device capturing images of an external environment, in accordance with one or more aspects of the present disclosure.

FIG. 23 illustrates a side view of accessory device 100 supporting electronic device 430, further showing camera assembly 436a of electronic device 430 capturing images of an external environment, in accordance with one or more aspects of the present disclosure. As shown, camera assembly 436a has a field of view 492 that is capable of capturing a user 493 of electronic device 430 and an object 494 on a surface 495 on which accessory device 100 is positioned. As non-limiting examples, object 494 may include literature (e.g., magazine, book, newspaper, or the like).

Figure 24:
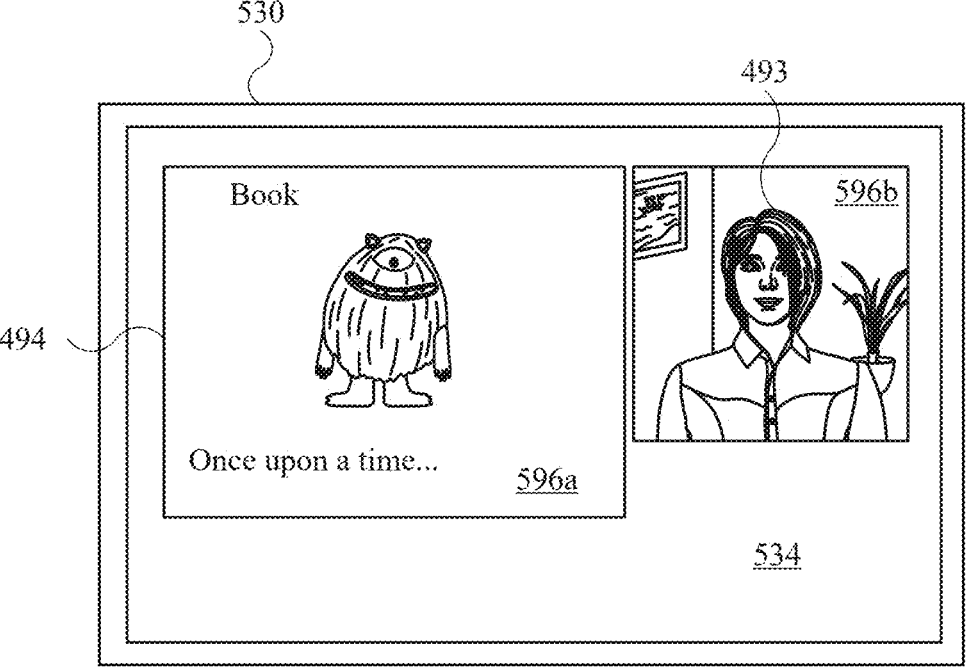
FIG. 24 illustrates a front view of an electronic device, showing a display of the electronic device presenting the captured images from the camera assembly shown in FIG. 23, in accordance with one or more aspects of the present disclosure.

FIG. 24 illustrates a front view of an electronic device 530, showing a 534 display of electronic device 530 presenting the captured images from camera assembly 436a shown in FIG. 23, in accordance with one or more aspects of the present disclosure. Electronic device 530 may take the form of electronic device 330 (shown in FIG. 6A) or electronic device 430 (shown in FIGS. 6B and 22), as non-limiting examples. As shown, electronic device 530 is in communication with electronic device 430 by, for example, a wireless network (e.g., WI-FI®) or a cellular network, as non-limiting examples.

Electronic device 530 may process the captured images of user 493 of electronic device 430 and object 494, and present user 493 and object 494 on display 534. For example, display 534 may present a window 596a to show one or more captured images of object 494. Further, display 534 may present a window 596b to show one or more captured images of user 493. As a result, a user of electronic device 530 may view user 493 as well as object 494 on display 534. Moreover, electronic device 530 may include one or more audio modules (not shown in FIG. 24). In this regard, a user of electronic device 530 may listen to user 493 speak. Moreover, when object 494 takes the form of literature, the user of electronic device 530 may listen to user 493 read object 494.

Figure 25:
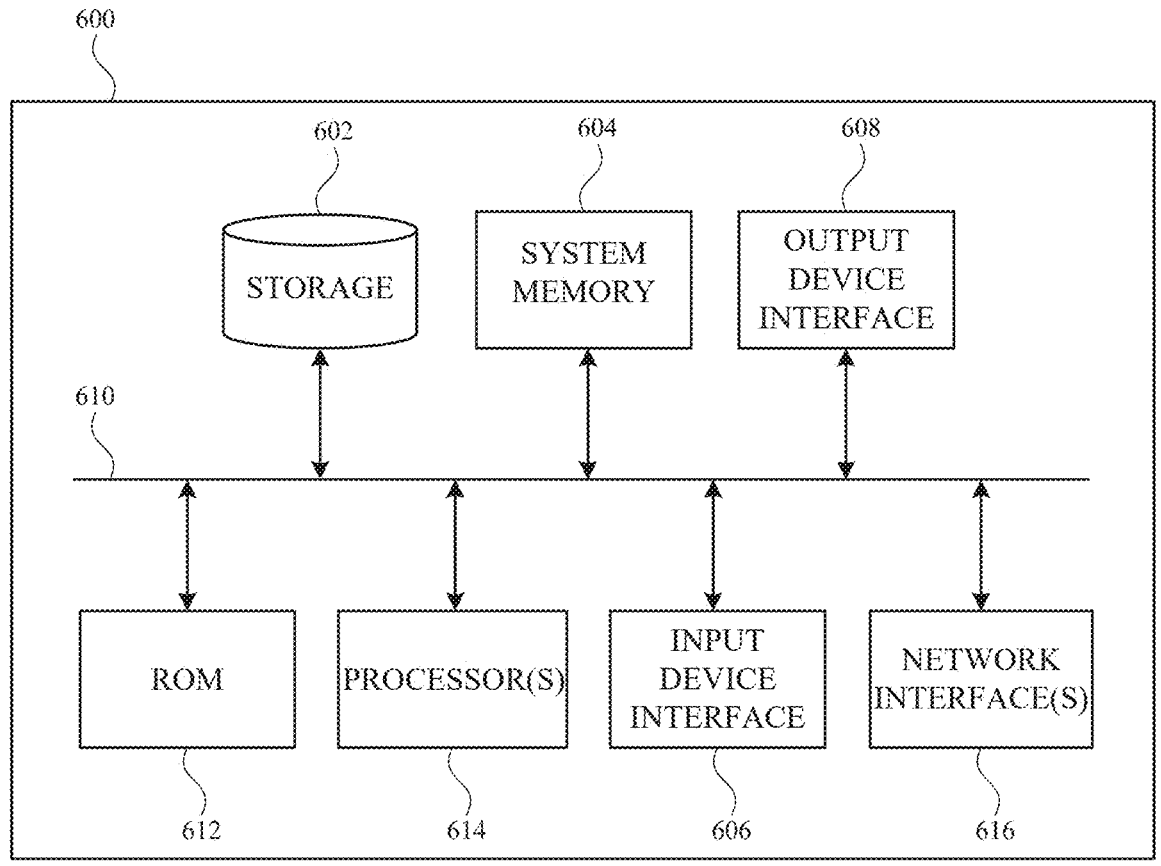
FIG. 25 illustrates a block diagram of an electronic device with which one or more implementations of the subject technology may be implemented.

FIG. 25 illustrates a block diagram of an electronic system 600 with which one or more implementations of the subject technology may be implemented. The electronic system 600 can be, and/or can be a part of, electronic device 330 and electronic device 430 as shown in FIG. 6A and FIG. 6B, respectively. The electronic system 600 may include various types of computer readable media and interfaces for various other types of computer readable media. The electronic system 600 includes a bus 610, one or more processors 614, a system memory 604 (and/or buffer), a ROM 612, a permanent storage device 602, an input device interface 606, an output device interface 608, and one or more network interfaces 616, or subsets and variations thereof.

The bus 610 collectively represents all system, peripheral, and chipset buses that communicatively connect the numerous internal devices of the electronic system 600. In one or more implementations, the bus 610 communicatively connects the one or more processors 614 with the ROM 612, the system memory 604, and the permanent storage device 602. From these various memory units, the one or more processors 614 retrieves instructions to execute and data to process in order to execute the processes of the subject disclosure. The one or more processors 614 can be a single processor or a multi-core processor in different implementations.

The ROM 612 stores static data and instructions that are needed by the one or more processors 614 and other modules of the electronic system 600. The permanent storage device 602, on the other hand, may be a read-and-write memory device. The permanent storage device 602 may be a non-volatile memory unit that stores instructions and data even when the electronic system 600 is off. In one or more implementations, a mass-storage device (such as a magnetic or optical disk and its corresponding disk drive) may be used as the permanent storage device 602.

In one or more implementations, a removable storage device (such as a flash drive, and its corresponding disk drive) may be used as the permanent storage device 602. Like the permanent storage device 602, the system memory 604 may be a read-and-write memory device. However, unlike the permanent storage device 602, the system memory 604 may be a volatile read-and-write memory, such as random access memory. The system memory 604 may store any of the instructions and data that one or more processors 614 may need at runtime. In one or more implementations, the processes of the subject disclosure are stored in the system memory 604, the permanent storage device 602, and/or the ROM 612 (which are each implemented as a non-transitory computer-readable medium). From these various memory units, the one or more processors 614 retrieves instructions to execute and data to process in order to execute the processes of one or more implementations.

The bus 610 also connects to the input device interface 606 and output device interface 608. The input device interface 606 enables a user to communicate information and select commands to the electronic system 600. Input devices that may be used with the input device interface 606 may include, for example, alphanumeric keyboards and pointing devices (also called "cursor control devices"). The input device interface 606 may enable, for example, the display of images generated by electronic system 600. Output devices that may be used with the input device interface 606 may include, for example, printers and display devices, such as a liquid crystal display (LCD), a light emitting diode (LED) display, an organic light emitting diode (OLED) display, a flexible display, a flat panel display, a solid state display, a projector, or any other device for outputting information. Additionally, the input device interface 606 may include one or more temperature sensors (e.g., thermistor, thermocouple) designed to monitor temperature (e.g., current temperature) of the one or more processors 614 and provide a signal used by the one or more processors 614 to determine whether to limit at least one processor of the one or more processors 614 to operate up to a first temperature limit, or allow the at least one processor to operate up to a second, higher temperature limit. One or more implementations may include devices that function as both input and output devices, such as a touchscreen. In these implementations, feedback provided to the user can be any form of sensory feedback, such as visual feedback, auditory feedback, or tactile feedback. An input from the user can be received in any form, including acoustic, speech, or tactile input.

Finally, as shown in FIG. 25, the bus 610 also couples the electronic system 600 to one or more networks. In this manner, the electronic system 600 can be a part of a network of computers (such as a LAN, a wide area network ("WAN"), or an Intranet, or a network of networks, such as the Internet. Any or all components of the electronic system 600 can be used in conjunction with the subject disclosure.

Various examples of aspects of the disclosure are described below as clauses for convenience. These are provided as examples, and do not limit the subject technology.

Clause A: An electronic device may include a housing. The electronic device may further include a display carried by the housing. The electronic device may further include a sensor positioned between the housing and the display, the sensor configured to detect an accessory device covering the housing and the display.

Clause B: An electronic device may include a housing. The electronic device may further include a display carried by the housing. The electronic device may further include a sensor positioned between the housing and the display. The electronic device may further include a one or more processors electrically coupled to the display and the sensor. The one or more processors may be configured to: determine, based on a first output from the sensor, an accessory device is covering the display and the housing, and determine, based on a second output from the sensor, the accessory device is covering the housing and not the display.

Clause C: An electronic device may include a housing. The electronic device may further include a display carried by the housing. The electronic device may further include a camera assembly. The electronic device may further include a sensor positioned between the housing and the display. The electronic device may further include one or more processors configured to: determine, based on a first output from the sensor, an accessory device is covering the display, the camera assembly, and the housing, determine, based on a second output from the sensor, the accessory device is covering the housing and not the display and not the camera assembly, and activate, based on the second output, a software application configured to utilize the camera assembly.

One or more of the above clauses can include one or more of the features described below. It is noted that any of the following clauses may be combined in any combination with each other, and placed into a respective independent clause, e.g., clause A, B, or C.

Clause 1: wherein the sensor includes a magnetic field sensor configured to detect: a first magnetic flux, in a first direction, from a first magnet and from a second magnet of the accessory device, and a second magnetic flux, in a second direction, from the first magnet and from the second magnet, the second direction different from the first direction.

Clause 2: further including one or more processors configured to determine, based on detection by the sensor of the first magnetic flux in the first direction, the accessory device is covering the display and the housing.

Clause 3: wherein the one or more processors are further configured to determine, based on detection by the sensor of the second magnetic flux in the second direction, the accessory device is covering the housing and not the display.

Clause 4: wherein the one or more processors are further configured to deactivate the display based on detection by the sensor of the first magnetic flux in the first direction.

Clause 5: wherein: at least one processor of the one or more processors is configured to operate in accordance with a first temperature limit based on detection by the sensor of the first magnetic flux in the first direction, and based on detection by the sensor of the second magnetic flux in the second direction, the at least one processor is configured to operate in accordance with a second temperature limit different from the first temperature limit.

Clause 6: wherein the second temperature limit is greater than the first temperature limit.

Clause 7: wherein the magnetic field sensor includes a single magnetic field sensor.

Clause 8: wherein the sensor is configured to: provide the first output based on detection of a first magnetic field from a first magnet and from a second magnet of the accessory device, and provide the second output based on detection of a second magnetic field from the first magnet and from the second magnet.

Clause 9: wherein the sensor is configured to: detect the first magnetic field in a first direction, and detect the second magnetic field in a second direction different from the first direction.

Clause 10: wherein the one or more processors are configured to deactivate the display based on receiving the first output from the sensor.

Clause 11: wherein the one or more processors are configured to determine, based on the second output from the sensor, a first section of the accessory device is covered by a second portion of the accessory device.

Clause 12: wherein the sensor includes a magnetic field sensor configured to determine magnetic flux in different directions.

Clause 13: wherein: at least one processor of the one or more processors is configured to operate in accordance with a first temperature limit, and based on the second output, the at least one processor is configured to operate in accordance with a second temperature limit different from the first temperature limit.

Clause 14: wherein the second temperature limit is greater than the first temperature limit.

Clause 15: wherein: at least one processor of the one or more processors is configured to operate in accordance with a first temperature limit based on the first output, and based on the second output, the at least one processor is configured to operate in accordance with a second temperature limit greater than the first temperature limit.

Clause 16: wherein the camera assembly includes a front camera configured to capture an image of an environment facing the display.

Clause 17: wherein the camera assembly includes a rear camera configured to capture an image of an environment facing the housing.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other embodiments. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An electronic device, comprising:
a housing;
a display carried by the housing;
a sensor positioned between the housing and the display, the sensor configured to detect:
a first magnetic flux, in a first direction, from a first magnet and from a second magnet of an accessory device, and
a second magnetic flux, in a second direction, from the first magnet and from the second magnet, the second direction different from the first direction; and
one or more processors, wherein;
in response to detection, by the sensor, of the first magnetic flux, the one or more processors determines the accessory device is covering the display and the housing, and
in response to detection, by the sensor, of the second magnetic flux, the one or more processors determines the accessory device is covering the housing and not the display.

2. The electronic device of claim 1, wherein the one or more processors are further configured to determine, based on detection by the sensor of the second magnetic flux in the second direction, the accessory device is covering the housing and not the display.

3. The electronic device of claim 1, wherein the one or more processors are further configured to deactivate the display based on detection by the sensor of the first magnetic flux in the first direction.

4. The electronic device of claim 1, wherein:
at least one processor of the one or more processors is configured to operate in accordance with a first temperature limit based on detection by the sensor of the first magnetic flux in the first direction, and
based on detection by the sensor of the second magnetic flux in the second direction, the at least one processor is configured to operate in accordance with a second temperature limit different from the first temperature limit.

5. The electronic device of claim 4, wherein the second temperature limit is greater than the first temperature limit.

6. The electronic device of claim 1, wherein the magnetic field sensor comprises a single magnetic field sensor.

7. The electronic device of claim 1, in response to detection, by the sensor, of a third magnetic flux based on the second magnet, the one or more processors determines the accessory device is covering the housing and not the display.

8. The electronic device of claim 7, wherein the sensor is a Hall effect sensor.

9. An electronic device, comprising:

a housing;

a display carried by the housing;

a sensor positioned between the housing and the display; and one or more processors electrically coupled to the display and the sensor, the one or more processors configured to:

determine, based on a first output from the sensor, an accessory device is covering the display and the housing, and determine, based on a second output from the sensor, the accessory device is covering the housing and not the display, wherein:

at least one processor of the one or more processors is configured to operate in accordance with a first temperature limit, and based on the second output, the at least one processor is configured to operate in accordance with a second temperature limit different from the first temperature limit.

10. The electronic device of claim 9, wherein the sensor is configured to:

provide the first output based on detection of a first magnetic field from a first magnet and from a second magnet of the accessory device, and provide the second output based on detection of a second magnetic field from the first magnet and from the second magnet.

11. The electronic device of claim 10, wherein the sensor is configured to:

detect the first magnetic field in a first direction, and detect the second magnetic field in a second direction different from the first direction.

12. The electronic device of claim 9, wherein the one or more processors are configured to deactivate the display based on receiving the first output from the sensor.

13. The electronic device of claim 9, wherein the one or more processors are configured to determine, based on the second output from the sensor, a first section of the accessory device is covered by a second portion of the accessory device.

14. The electronic device of claim 9, wherein the sensor comprises a magnetic field sensor configured to determine magnetic flux in different directions.

15. The electronic device of claim 9, wherein the second temperature limit is greater than the first temperature limit.

16. An electronic device, comprising:

a housing;

a display carried by the housing;

a camera assembly;

a sensor positioned between the housing and the display; and one or more processors configured to:

determine, based on a first output from the sensor, an accessory device is covering the display, the camera assembly, and the housing, determine, based on a second output from the sensor, the accessory device is covering the housing and not the display and not the camera assembly, and activate, based on the second output, a software application configured to utilize the camera assembly, wherein;

at least one processor of the one or more processors is configured to operate in accordance with a first temperature limit based on the first output, and based on the second output, the at least one processor is configured to operate in accordance with a second temperature limit greater than the first temperature limit.

17. The electronic device of claim 16, wherein the camera assembly comprises a front camera configured to capture an image of an environment facing the display.

18. The electronic device of claim 17, wherein the camera assembly comprises a rear camera configured to capture an image of an environment facing the housing.

19. The electronic device of claim 17, wherein the front camera is configured to capture a user and an object.

20. The electronic device of claim 19, wherein the display is configured to, one or more processors, present;

the user in a first window, and the object in a second window different from the first window.

\* \* \* \* \*